United States Patent
Kawatani

(10) Patent No.: US 9,679,353 B2
(45) Date of Patent: Jun. 13, 2017

(54) PLAN DISPLAY DEVICE THAT DISPLAYS ENLARGED/REDUCED IMAGE OF ORIGINAL IMAGE WITH INDICATION AND PLAN DISPLAY PROGRAM FOR DISPLAYING SAME

(71) Applicant: OKI DATA INFOTECH CORPORATION, Chiba-shi, Chiba (JP)

(72) Inventor: Satoshi Kawatani, Chiba (JP)

(73) Assignee: Oki Data Infotech Corporation, Chiba-shi, Chiba (JP)

( * ) Notice: Subject to any disclaimer, the term of this patent is extended or adjusted under 35 U.S.C. 154(b) by 148 days.

(21) Appl. No.: 14/368,680

(22) PCT Filed: Nov. 19, 2012

(86) PCT No.: PCT/JP2012/079906
§ 371 (c)(1),
(2) Date: Jun. 25, 2014

(87) PCT Pub. No.: WO2013/136594
PCT Pub. Date: Sep. 19, 2013

(65) Prior Publication Data
US 2015/0091908 A1    Apr. 2, 2015

(30) Foreign Application Priority Data

Mar. 16, 2012  (JP) .................................. 2012-059843

(51) Int. Cl.
*G06T 3/00*      (2006.01)
*G06T 11/00*     (2006.01)
(Continued)

(52) U.S. Cl.
CPC ........ *G06T 3/0006* (2013.01); *G06F 17/5004* (2013.01); *G06T 3/20* (2013.01);
(Continued)

(58) Field of Classification Search
None
See application file for complete search history.

(56) References Cited

U.S. PATENT DOCUMENTS

| | | | | | |
|---|---|---|---|---|---|
| 5,640,468 | A * | 6/1997 | Hsu | ..................... | G06K 9/00201 |
| | | | | | 382/190 |
| 6,310,631 | B1 * | 10/2001 | Cecco | ................... | G06F 3/0481 |
| | | | | | 715/792 |
| 6,803,931 | B1 * | 10/2004 | Roman | ................. | G06F 3/0481 |
| | | | | | 345/661 |
| 7,417,645 | B2 * | 8/2008 | Beda | ....................... | G06T 11/20 |
| | | | | | 345/473 |
| 8,599,221 | B2 * | 12/2013 | Wakizaka | ............. | G06F 3/0481 |
| | | | | | 345/619 |
| 9,053,080 | B2 * | 6/2015 | Look | ..................... | G06F 3/0481 |
| 2006/0087520 | A1 * | 4/2006 | Ito | ......................... | G06F 3/0481 |
| | | | | | 345/660 |
| 2006/0109144 | A1 * | 5/2006 | Xu | .......................... | G01C 21/20 |
| | | | | | 340/995.15 |
| 2006/0285164 | A1 * | 12/2006 | Wang | ................... | G06T 15/503 |
| | | | | | 358/3.01 |

(Continued)

FOREIGN PATENT DOCUMENTS

JP    2006301421    11/2006

OTHER PUBLICATIONS w3schools.com "CSS Dimension", http://www.w3schools.com/Css/css_dimension.asp Feb. 27, 2009.*

*Primary Examiner* — Jason Pringle-Parker
(74) *Attorney, Agent, or Firm* — Muncy, Geissler, Olds & Lowe, P.C.

(57) ABSTRACT

When enlarged/reduced images to be displayed based on a predetermined original image are displayed on a display screen, each of the enlarged/reduced images is created and displayed at a higher speed. Therefore, desired regions within an original image are designated, and desired images including the entire designated desired region are read from the original image, and stored separately from the original image. Then, an enlargement/reduction ratio with respect to the original image is acquired, and an enlarged/reduced original image obtained by enlarging/reducing the original image with the enlargement/reduction ratio in both a long-side direction and a short-side direction is created and displayed on a display screen. Further, enlarged/reduced desired images obtained by enlarging/reducing the desired images that are separately stored only in the long-side direction with the enlargement/reduction ratio are created (Continued)

and displayed in the vertical/horizontal target regions so as to be superimposed on the enlarged/reduced original image.

11 Claims, 11 Drawing Sheets

(51) Int. Cl.
  *G06F 17/50* (2006.01)
  *G06T 3/40* (2006.01)
  *G06T 3/20* (2006.01)
  *G06T 11/60* (2006.01)
  *G09G 5/00* (2006.01)

(52) U.S. Cl.
  CPC .............. *G06T 3/40* (2013.01); *G06T 3/4092* (2013.01); *G06T 11/001* (2013.01); *G06T 11/60* (2013.01); *G09G 5/00* (2013.01); *G06T 2207/20104* (2013.01); *G06T 2207/20172* (2013.01); *G06T 2207/20221* (2013.01); *G06T 2210/04* (2013.01); *G06T 2210/36* (2013.01); *G09G 2340/045* (2013.01); *G09G 2340/14* (2013.01)

(56) References Cited

U.S. PATENT DOCUMENTS

| | | | |
|---|---|---|---|
| 2007/0109323 A1* | 5/2007 | Nakashima | G01C 21/3664 345/661 |
| 2009/0263038 A1* | 10/2009 | Luo | G06K 9/32 382/254 |
| 2010/0199227 A1* | 8/2010 | Xiao | G06F 3/0481 715/863 |
| 2011/0285748 A1* | 11/2011 | Slatter | G06T 11/60 345/629 |
| 2013/0125050 A1* | 5/2013 | Goshey | G06F 3/048 715/800 |
| 2014/0327626 A1* | 11/2014 | Harrison | G06F 3/0416 345/173 |

* cited by examiner

PLAN DISPLAY DEVICE THAT DISPLAYS ENLARGED/REDUCED IMAGE OF ORIGINAL IMAGE WITH INDICATION AND PLAN DISPLAY PROGRAM FOR DISPLAYING SAME

TECHNICAL FIELD

The present invention relates to a drawing display device and a drawing display program, for example, relates to a technology for displaying a plurality of regions from various digitized drawings such as an architectural design drawing and a civil engineering drawing.

BACKGROUND ART

Up to now, drawings printed on paper are used in a building site, a civil engineering site, and the like, but an enormous number of sheets of drawings may be used, and it is burdensome for a user to carry around the drawings printed on the paper and perform work using the printed drawings.

Therefore, attention is being focused on a tablet-type image display device that allows drawing data for printing on paper, which is managed in a drawing database or the like, to be carried around easily. The tablet-type image display device has a disadvantage in that a display screen thereof is far smaller than the printed drawing used on site.

In contrast, by using various functions of a terminal device such as enlargement and reduction of the drawing being displayed and movement (scrolling) of a display region thereof, even when an image (drawing) having a large size such as A0 size and A1 size is handled, a tablet-type display terminal having only a screen area of a fraction of the image (drawing) can be used to display and view the image (drawing). In addition, there is an advantage in that the image can be displayed to be larger than the printed drawing depending on an enlargement ratio.

However, a tablet-type drawing display device is advantageous in having an enlargement ability, whereas it may be hard to recognize which portion of the entire image (drawing) is being enlarged and displayed at a time of the enlargement.

For example, in an architectural drawing, center lines for columns and walls may be displayed as base lines, and each of the base lines may be denoted by a base line number, the base line number being generally described around the drawing, for example, on the left, right, top, or bottom thereof.

Accordingly, there is a problem in that, when a location apart from the base line number is enlarged and displayed, it is impossible to grasp the base line numbers for the walls and the columns that are being displayed.

In order to solve the above-mentioned problem, Patent Literature 1 proposes a technology for setting a region including the base line number within entire image data as a guide image region and displaying a main body image region and the guide image region that are cut out from one entire image data.

CITATION LIST

Patent Literature

[PTL 1] JP 2006-301421 A

SUMMARY OF INVENTION

Technical Problem

In the technology disclosed in Patent Literature 1, coordinate data that designates each of: a map region 211 serving as a region to be displayed on a display device after being cut out from entire image data 200 based on one sheet of drawing data; and a horizontal guide region 212 and a vertical guide region 213 that represent base lines, is stored as region information, and three images are cut out and displayed based on the region information converted in accordance with a designated enlargement/reduction ratio.

Accordingly, it takes much time to display each image after enlargement/reduction thereof. In particular, in a case of the drawing data having a high resolution (for example, 600 dpi) and having the A0 or A1 size when printed on paper as in an architectural drawing, it is necessary to frequently perform enlargement/reduction processing by displaying the entire drawing or displaying the drawing to have the same size as a paper size, which may cause a delay in entire work.

Further, different three regions are extracted from one entire image data 200 that is common thereto, and hence it is impossible to employ a general-purpose program for performing enlargement/reduction display for the image, which necessitates a dedicated program.

Further, different three regions are extracted from the entire image data 200 that is common thereto, and hence the base line numbers displayed on the horizontal/vertical guide regions 212 and 213 can be displayed only with the same enlargement/reduction ratio as that of the map region 211 both horizontally and vertically.

Accordingly, part of the base line numbers in a short-side direction cannot be displayed, which may pose a problem for reading of the base line number depending on an enlargement ratio.

Therefore, a first object according to the present invention is to create and display each of a plurality of enlarged/reduced images to be displayed based on a predetermined original image at a higher speed in a case of displaying the enlarged/reduced images on a display screen.

Solution to Problem (1) According to the invention of claim 1, there is provided a drawing display device, including: original image storage means for storing an original image; region designation means for designating a desired region within the original image; desired image saving means for reading a desired image including the entire designated desired region from the original image and storing the desired image separately from the original image; enlargement/reduction ratio acquisition means for acquiring an enlargement/reduction ratio (P) with respect to the original image; enlarged/reduced original image creating means for creating an enlarged/reduced original image by enlarging/reducing the original image with the acquired enlargement/reduction ratio (P) in both a long-side direction thereof and a short-side direction thereof; enlarged/reduced desired image creating means for creating an enlarged/reduced desired image by enlarging/reducing the desired image with the acquired enlargement/reduction ratio (P) at least in the long-side direction of the desired image; and display means for displaying the created enlarged/reduced original image and the enlarged/reduced desired image together.

(2) According to the invention of claim 2, there is provided a drawing display device of claim 1, in which the desired region is a rectangular region.

(3) According to the invention of claim 3, there is provided a drawing display device of claim 2, in which the enlarged/reduced desired image creating means enlarges/reduces the desired image with the acquired enlargement/reduction ratio (P) in the long-side direction of the desired region and with a fixed reduction ratio (S) in the short-side direction of the desired region.

(4) According to the invention of claim 4, there is provided a drawing display device of claim 2 or 3, further including movement amount acquisition means for acquiring a movement amount for changing a display range of the enlarged/reduced original image, in which the display means performs display by moving the enlarged/reduced original image by the acquired movement amount and moving the enlarged/reduced desired image in the long-side direction of the enlarged/reduced image by a long-side direction component amount of the acquired movement amount.

(5) According to the invention of claim 5, there is provided a drawing display device of any one of claims 2 to 4, in which: the region designation means designates the desired region within the original image by designating the rectangular region of the enlarged/reduced desired image displayed by the display means; and the reduction ratio (S) is an enlargement/reduction ratio of the enlarged/reduced desired image, which is displayed by the display means when the rectangular region is designated by the region designation means, to the original image.

(6) According to the invention of claim 6, there is provided a drawing display device of any one of claims 2 to 5, in which the desired image saving means reads and stores the same range as a width of the designated desired region in the short-side direction and the entire range of the original image in the long-side direction.

(7) According to the invention of claim 7, there is provided a drawing display device of any one of claims 1 to 6, in which the desired image saving means reads the desired image from raster data created with a predetermined resolution when the original image is vector data.

(8) According to the invention of claim 8, there is provided a drawing display device of any one of claims 1 to 7, in which: the desired image saving means performs mask processing for the read original image and then stores the resultant as the desired image; and the display means displays the enlarged/reduced desired image superimposed on the enlarged/reduced original image.

(9) According to the invention of claim 9, there is provided a drawing display device of claim 8, in which the mask processing performed by the desired image saving means is processing for causing the enlarged/reduced original image on a lower layer to be transparent with respect to data representing a specific color.

(10) According to the invention of claim 10, there is provided a drawing display device of any one of claims 1 to 9, in which the display means includes enlarged/reduced desired image moving means for moving a display position of the enlarged/reduced desired image to another position within the enlarged/reduced original image.

(11) According to the invention of claim 11, there is provided a drawing display program for causing a computer to implement : a region designation function of designating a desired region within an original image stored in original image storage means; a desired image saving function of reading a desired image including the entire designated desired region from the original image and storing the desired image separately from the original image; an enlargement/reduction ratio acquisition function of acquiring an enlargement/reduction ratio (P) with respect to the original image; an enlarged/reduced original image creating function of creating an enlarged/reduced original image by enlarging/reducing the original image with the acquired enlargement/reduction ratio (P) in both a long-side direction thereof and a short-side direction thereof; an enlarged/reduced desired image creating function of creating an enlarged/reduced desired image by enlarging/reducing the desired image with the acquired enlargement/reduction ratio (P) at least in the long-side direction of the desired image; and a display function of displaying the created enlarged/reduced original image and the enlarged/reduced desired image together.

Advantageous Effects of Invention

According to one embodiment of the present invention, the desired image including the entire designated desired region is read from the original image and stored separately from the original image, the enlarged/reduced original image is created from the original image while the enlarged/reduced desired image is created from the desired image, and the created enlarged/reduced original image and enlarged/reduced desired image are displayed, which enables each of the enlarged/reduced images to be created and displayed at a higher speed.

DESCRIPTION OF EMBODIMENTS

Now, a drawing display device according to a preferred embodiment of the present invention is described in detail by taking an example of a tablet-type terminal device with reference to FIG. 1 to FIG. 11.

(1) Outline of Embodiment (a) Target Setting Processing

Figure 4A:
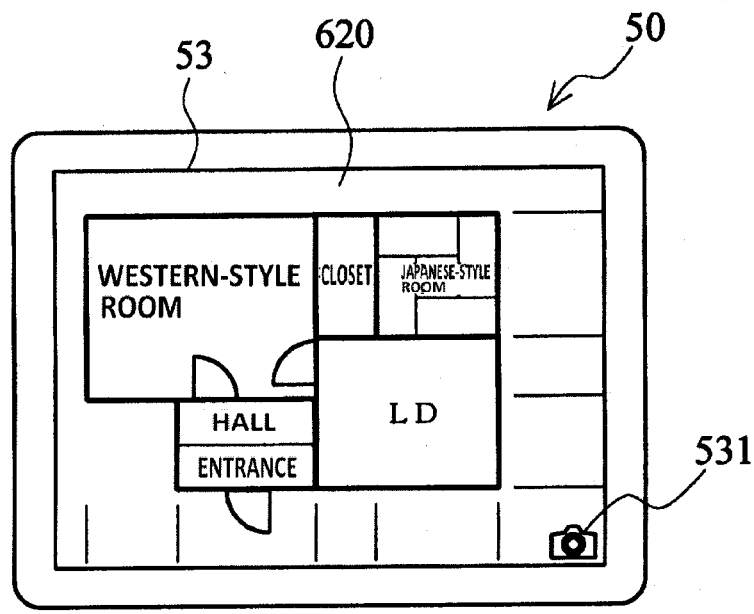
FIG. 4 are explanatory diagrams illustrating display screens obtained before and after a target selection button is selected.
Figure 4B:
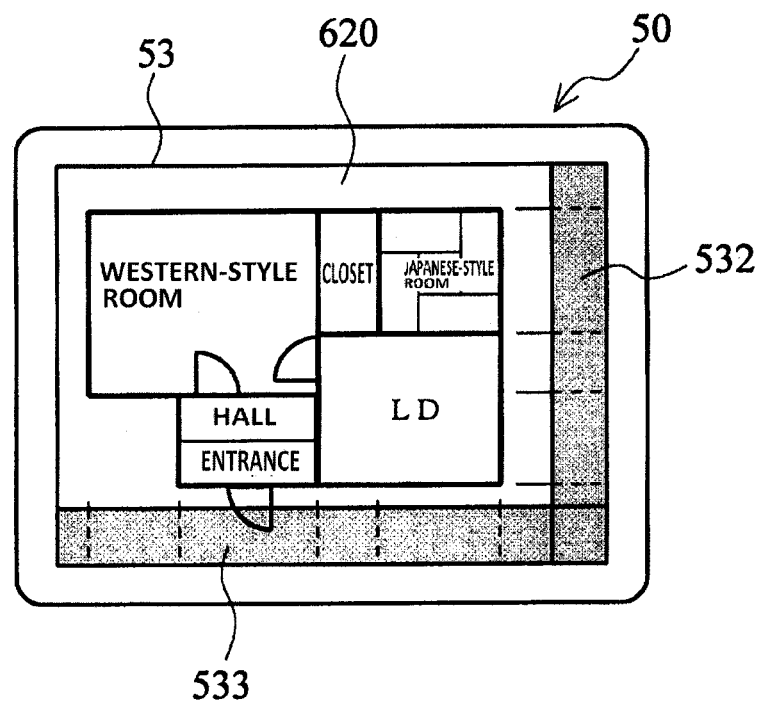

In this embodiment, as illustrated in FIG. 4 and FIG. 5, an enlarged/reduced original image 620 obtained by subjecting an original image of an architectural drawing or the like to the enlargement/reduction processing is displayed on a display screen 53 of a drawing display device 50.

Then, vertical/horizontal target regions (rectangular regions) 532 and 533 are displayed at a right edge and a bottom edge of the display screen 53, respectively.

A user instructs enlargement/reduction or movement for the enlarged/reduced original image 620 displayed on the display screen 53 by a screen operation (pinch operation, dragging operation, or the like), to thereby cause a desired image portion to be displayed within the rectangular regions 532 and 533 and issue an instruction to set a target image.

When the instruction to set the target image is issued, images corresponding to predetermined regions (desired regions) including the enlarged/reduced original image 620 being displayed in the rectangular regions 532 and 533 are read from the original image and saved separately as vertical/horizontal target images (desired image).

To save the images separately as the vertical/horizontal target images, mask processing is performed so that a white part of the original image is formed of transparent dots.

(b) Target Follow-Up Processing After the Target is Set

Figure 8E:
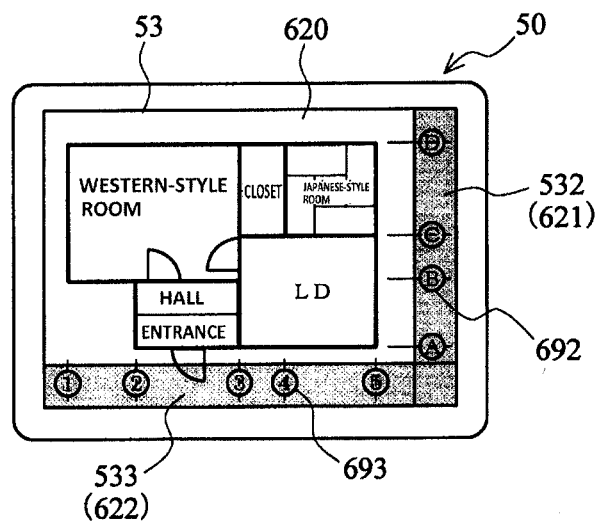
FIG. 8 are explanatory diagrams illustrating the display screens obtained after movement processing and after enlargement/reduction processing during the follow-up processing.

After the setting (saving) of the target image is completed, as illustrated in FIG. 8(e), the enlarged/reduced original image 620 obtained by enlarging/reducing the original image is displayed on the display screen 53. Further, enlarged/reduced vertical/horizontal target images 621 and 622 obtained by subjecting the vertical/horizontal target images to the enlargement/reduction processing are displayed in the rectangular regions 532 and 533.

When a pinch-out operation for an enlargement/reduction ratio Q is performed with reference to the enlarged/reduced image 620 of FIG. 8(e), the enlargement/reduction target images 621 and 622 each having the same size in a short-side direction and exhibiting the enlargement/reduction ratio Q only in a long-side direction are displayed in the rectangular regions 532 and 533, respectively.

Figure 8F:
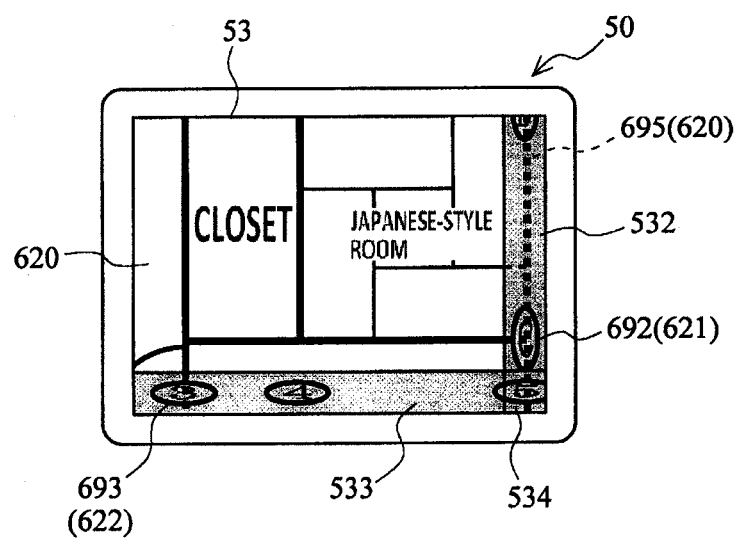

As illustrated in FIG. 8(f), the enlarged/reduced vertical/horizontal target images 621 and 622 displayed in the rectangular regions 532 and 533 are each unchanged to have the same size in the short-side direction, and therefore do not overflow from the rectangular regions 532 and 533 when the enlarged/reduced original image 620 is enlarged. Accordingly, base line numbers 692 and 693 are not inhibited from being read in the vertical/horizontal target images including the base line numbers within the architectural drawing or the like.

Further, the rectangular regions 532 and 533 are set so as to be superimposed on the display screen 53, but the enlarged/reduced vertical/horizontal target images 621 and 622 have been subjected to the mask processing, and hence a wall surface line 695 corresponding to the base line number "5", which is a part of the enlarged/reduced original image 620, is displayed transparently (displayed as a dotted line).

With this configuration, the entire display screen 53 can be set as a display region of the enlarged/reduced original image 620, and portions having overlaps with the rectangular region can be distinguished from the enlarged/reduced vertical/horizontal target images 621 and 622 due to settings of a transmittance and a transparent color.

(2) Definitions of Terms

First, terms used in this embodiment are defined as follows.

(a) Original image 690: drawing data (excluding attribute information) having a raster format or a vector format, which serves as a base of a drawing (image) to be mainly displayed on the display screen 53.

(b) Enlarged/reduced original image 620: an image obtained by enlarging or reducing the original image 690 with an enlargement/reduction ratio P (described later). In this embodiment, a necessary region is written into a memory for display after being temporarily formed in a RAM, but may be written from the original image 690 directly into the memory for display.

(c) Vertical target image 700: an image having a raster format, which is obtained by reading a predetermined region from the original image 690 in accordance with the vertical target region 532 and saving the predetermined region separately to a storage device.

When the original image 690 has a vector format, the predetermined region is read from the original image 690 temporarily created to have a raster format.

A predetermined range read from the original image 690 is the same range (range within which the same image is displayed) as the vertical target region 532 in the short-side direction and an entire range of the original image 690 in the long-side direction.

In this embodiment, the vertical target image 700 is saved to the storage device, but may be saved to the RAM.

(d) Horizontal target image 710: an image having a raster format, which is obtained by reading a predetermined region from the original image 690 in accordance with the horizontal target region 533 and saving the predetermined region separately to the storage device.

When the original image 690 has a vector format, the predetermined region is read from the original image 690 temporarily created to have a raster format.

A predetermined range read from the original image 690 is the same range (range within which the same image is displayed) as the horizontal target region 533 in the short-side direction and an entire range of the original image 690 in the long-side direction.

In this embodiment, the horizontal target image 710 is saved to the storage device, but may be saved to the RAM.

(e) Vertical/horizontal target images 700 and 710: the vertical target image 700 and the horizontal target image 710.

(f) Enlarged/reduced vertical target image 621: an image obtained by enlarging/reducing the vertical target image 700 with the enlargement/reduction ratio P in the long-side direction (vertical direction) and with the enlargement/reduction ratio Q in the short-side direction (horizontal direction).

(g) Enlarged/reduced horizontal target image 622: an image obtained by enlarging/reducing the horizontal target image 710 with the enlargement/reduction ratio P in the long-side direction (horizontal direction) and with the enlargement/reduction ratio Q in the short-side direction (vertical direction).

(h) Enlarged/reduced vertical/horizontal target images 621 and 622: the enlarged/reduced vertical target image 621 and the enlarged/reduced horizontal target image 622.

(i) Enlargement/reduction ratio Q: an enlargement/reduction ratio with reference to the enlarged/reduced original image 620 being displayed on the display screen 53, which is acquired from a movement amount of a finger or the like based on the pinch operation.

(j) Enlargement/reduction ratio R: an enlargement/reduction ratio of the enlarged/reduced original image 620 displayed immediately before the pinch operation with respect to the original image 690.

(k) Enlargement/reduction ratio P: an enlargement/reduction ratio of the enlarged/reduced original image 620 displayed after the pinch operation with respect to the original image 690, where P=Q×R.

(l) Enlargement/reduction ratio S: an enlargement/reduction ratio of the enlarged/reduced original image 620 displayed on a screen at a time when the target image is designated in target setting processing with respect to the original image 690.

(3) Details of Embodiment

Figure 1:
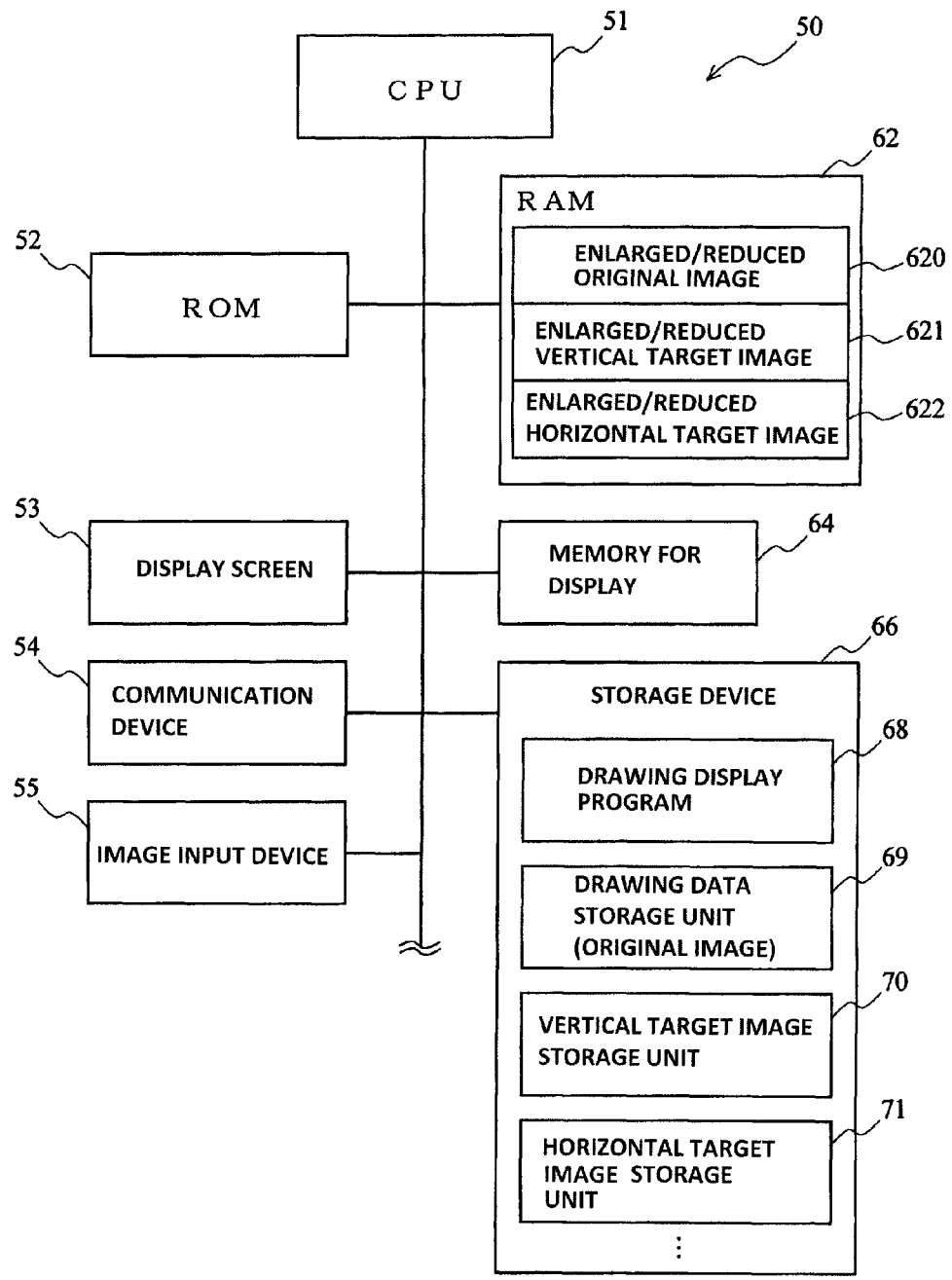
FIG. 1 is a configuration diagram of a drawing display device.

FIG. 1 is a diagram illustrating a configuration of the drawing display device 50.

The drawing display device 50 includes a CPU 51, a ROM 52, the display screen 53, a communication device 54, an image input device 55, a RAM 62, a memory 64 for display, and a storage device 66.

The CPU 51 centrally controls the respective components of the drawing display device 50 by executing information processing in accordance with various programs such as a drawing display program according to this embodiment.

For example, in this embodiment, the CPU 51 executes a target setting processing program saved in a drawing display program 68, to thereby perform the setting of the vertical/horizontal target regions 532 and 533, the saving of the vertical/horizontal target images 700 and 710 to be displayed in the two target regions 532 and 533, and the like. Further, the CPU 51 executes a target follow-up processing program, to thereby perform display of the vertical/horizontal target regions 532 and 533 so as to follow up display of the original image 690.

The ROM 52 is a read only memory that stores various programs to be executed by the CPU 51, parameters necessary to execute the programs, or the like.

The display screen 53 is a display device such as a liquid crystal display, and can display the drawing data such as the design drawing with a predetermined reduction scale. The number of pixels of the display screen 53 is arbitrary, but the description of this embodiment is directed to a case of using the display screen 53 having 1,024×768 pixels.

In this embodiment, on the display screen 53, the drawing data selected by the user is set as the original image 690, and all or a part of the image (enlarged/reduced original image 620) obtained by subjecting the original image 690 to enlargement or reduction (hereinafter referred to as "enlargement/reduction") in accordance with the screen operation is displayed.

Further, on the display screen 53, based on a user operation, the vertical target region 532 and the horizontal target region 533 that are rectangular are secured on one or both of the top side and the bottom side of the screen and on one or both of the left side and the right side (in this embodiment, right side and bottom side of the screen).

Then, the images of the regions desired to be kept displayed fixedly within the drawing data, for example, the images corresponding to portions for displaying symbols for base lines included in the drawing data, are selected as the vertical/horizontal target images 700 and 710 through the user operation, and the enlarged/reduced vertical/horizontal target images 621 and 622 obtained by enlarging and reducing the selected vertical/horizontal target images 700 and 710 are displayed in the vertical/horizontal target image regions 532 and 533.

At the bottom right of the display screen 53, the vertical/horizontal target regions 532 and 533 are secured, while a target selection button 531 (see FIG. 4), which is used to shift to an operation for setting the vertical/horizontal target images 700 and 710, is displayed.

The communication device 54 is an interface for communications used for connection to various networks such as a LAN and the Internet.

The communication device 54 allows transmission/reception therethrough to/from various servers and terminal devices, but the communication device 54 according to this embodiment is configured to function as drawing data (original image) acquisition means for acquiring the drawing data (digital drawing data) on the architectural drawing, a civil engineering drawing, or the like to be displayed on the display screen 53 from a drawing server or the like.

Note that, the drawing data can be acquired by another method, for example, may be acquired through the intermediation of a semiconductor memory such as a universal serial bus (USB).

In addition, when the drawing display device 50 includes a drawing creation program, the drawing data may be acquired by saving a drawing created by the program to the storage device 66.

Further, the drawing data may be acquired from another computer that stores the drawing data by performing connection thereto in a wired or wireless manner. The communication device 54 may also be configured to function as communication means even in the above-mentioned case where the connection is performed in a wired or wireless manner.

The image input device 55 is formed of a touch panel located on a front surface of the display screen 53, and has a function of inputting an operation instruction corresponding to a selection key by being touched in a position corresponding to each of the different "selection keys" displayed on the image input device 55. In this embodiment, a target selection button displayed on the display screen 53 corresponds to the selection key, and the target setting processing is executed when the image input device 55 is touched (tapped) in the position corresponding to the target selection button 531.

The image input device 55 allows various input operations such as tap, double tap, flick, and pinch.

A tap operation is an operation of tapping the screen in one point one time by the finger or the like.

A double tap operation is an operation of tapping the screen in one point two times in a row by the finger or the like.

The dragging operation is an operation of moving the finger or the like in close contact with the screen without a release therefrom.

A flick operation is an operation of moving the finger or the like in close contact with the screen so as to flip in a predetermined direction, and can designate eight directions of up, down, left, right, and diagonal directions therebetween.

In this embodiment, the flick operation or the dragging operation is used to change the display range of the original image 690 displayed on the display screen 53.

The pinch operation is an operation of moving two fingers or the like in close contact with two portions on the screen without a release therefrom, and includes a pinch-in operation of bringing two fingers closer together and a pinch-out operation of bringing two fingers apart from each other.

In this embodiment, the enlargement or reduction (enlargement/reduction) of the drawing displayed on the display screen 53 is instructed by the pinch operation. The enlargement/reduction ratio Q with reference to the drawing being currently displayed is input from the movement amount of the finger or the like based on the pinch operation, and the image obtained after the enlargement or the reduction with the enlargement/reduction ratio Q with reference to a center between coordinates of the positions of two fingers or the like first brought into close contact with the screen is displayed.

The RAM 62 functions as a working memory used when the CPU 51 performs various kinds of processing in accordance with the programs.

In this embodiment, a work area for storing the enlarged/reduced original image 620, the enlarged/reduced vertical target image 621, and the enlarged/reduced horizontal target image 622 is secured in the RAM 62 as a work area for the target setting processing program and the target follow-up processing program that are described later.

The memory 64 for display is a memory for storing image information to be displayed on the display screen 53, and a VRAM (video RAM) is used as the memory 64.

The enlarged/reduced original image 620 and the enlarged/reduced vertical/horizontal target images 621 and 622 are written to the memory 64 for display, and the images are displayed on the display screen 53.

Accordingly, the memory 64 for display has contents rewritten each time one of various operations for the enlargement, the reduction, and the movement is performed on the display screen 53.

The storage device 66 is formed of, for example, a large-capacity storage medium such as a hard disk drive and an electrically erasable programmable ROM (EEPROM).

The storage device 66 functions as the drawing display program 68 for displaying the drawing data by performing the enlargement and reduction therefor, a drawing data storage unit 69, a vertical target image storage unit 70, a horizontal target image storage unit 71, and storage means for storing other such data.

The drawing display program 68 includes the target image setting processing program and the target follow-up processing program according to this embodiment.

The CPU 51 executes the drawing display program 68 to select the drawing stored in the drawing data storage unit 69, thereby displaying the image exhibiting the designated enlargement/reduction ratio Q on the display screen 53 in regard to the designated region, and performing the setting, display, and follow-up processing for the target image.

The drawing data storage unit 69 saves various kinds of drawing data to be displayed on the display screen 53 in this embodiment, which are obtained by converting the architectural drawing, the civil engineering drawing, or the like into digital data.

Note that, the description of the drawing data according to this embodiment is directed to various design drawings such as a design drawing of a house, an apartment house, and the like, a design drawing of a high-rise building, and a design drawing for plant construction, but the present invention can be applied widely to various drawings such as an execution drawing for civil engineering work and an assembly drawing of a machine.

The drawing data saved in the drawing data storage unit 69 includes drawing data created by computer aided design (CAD) software and image data obtained by reading a drawing printed on paper by a scanner device.

The drawing data according to this embodiment is displayed on the display screen 53 after being enlarged or reduced, but is the original image data that has not yet been subjected to the enlargement or reduction, and hence the entire drawing data (excluding the attribute information on the drawing data) included in one file is described as the "original image 690".

As the data format of the original image 690 saved in the drawing data storage unit 69, any one of raster data having a GIF format, JPEG format, PING format, BMP format, or the like, and vector data may be used.

When the data format of the original image 690 is the raster data, an image size thereof is not particularly defined, and any size may be used.

However, in this embodiment, in order to speed up the processing, the original image 690 having 6,144×4,608 pixels is saved. The original image 690 has such a size as to become the A0 size when being printed on the paper with 150 dpi. Further, the values are six times as large as both the vertical and horizontal sizes of the display screen 53 having a size of 1,024×768 pixels, and are therefore suitable for high-speed processing.

Note that, data having a resolution of approximately 600 dpi may be saved in order to save a drawing having a higher display accuracy when saved to the server or the like as an original of the drawing data. In this case, 28,087×19,866 pixels are set for the drawing data having the A0 size at a time of printing.

The drawing data having a resolution of 600 dpi and 28,087×19,866 pixels can be saved to the drawing data storage unit 69 as the original image 690.

However, the description of this embodiment is directed to a case where, when the drawing data has a resolution of 600 dpi and 28,087×19,866 pixels, the drawing data having the resolution dropped from 600 dpi to 150 dpi to have a size of 6,144×4,608 pixels is generated and saved to the drawing data storage unit 69 as the original image 690.

Figure 2:
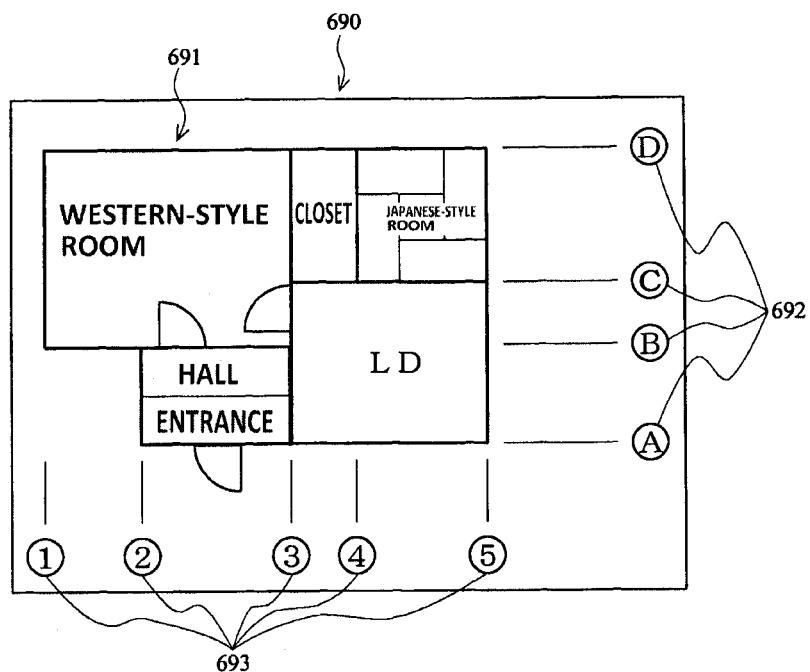
FIG. 2 is an explanatory diagram illustrating drawing data (original image) saved to a drawing data storage unit.

FIG. 2 illustrates an architectural drawing of housing as an example of the original image 690 based on the drawing data saved in the drawing data storage unit 69.

Note that, a frame line forming an external rectangle illustrated in FIG. 2 is displayed for the sake of convenience in grasping the range of the original image 690, and does not form a part of the drawing data.

The drawing data includes not only the original image 690 but also the attribute information such as reduction scale data indicating a reduction scale used when the original image 690 is printed on the paper in actual size and the vertical/horizontal resolutions (in the case of the raster format), and the original image 690 of FIG. 2 is expressed based on those pieces of attribute information.

As illustrated in FIG. 2, a building drawing 691 representing an object to be built, the base lines (indicated by thin straight lines) representing center lines of walls and columns outside the building drawing 691, and the base line numbers 692 in the vertical direction and the base line numbers 693 in the horizontal direction, which are assigned to the respective base lines, are described in the architectural drawing of the original image 690.

In the original image 690 exemplified in FIG. 2, circled alphabet letters of A to D and circled numbers of 1 to 5 are described as the base line numbers 692 in the vertical direction and the base line numbers 693 in the horizontal direction, respectively, in association with the respective base lines.

Note that, in the example of FIG. 2, the base lines and the base line numbers are described on the right side and the bottom side when facing the drawing, but may be described on the left side and the top side depending on the original drawing. In other words, the base line numbers 692 in the vertical direction may be described on one or both of the left side and the right side of the drawing, and the base line numbers 693 in the horizontal direction may be described on one or both of the top side and the bottom side of the drawing.

Returning to FIG. 1, in the vertical target image storage unit 70 and the horizontal target image storage unit 71 of the storage device 66, the images of regions corresponding to the regions designated by the user from the display screen 53 are read from the original image 690, to thereby be saved as a vertical target image and a horizontal target image, respectively, having the same resolution as that of the original image 690.

However, the vertical target image 700 and the horizontal target image 710 are both subjected to the mask processing when read from the original image 690. The mask processing is mask processing for causing pixels having a predetermined color to become transparent pixels through which an image on a layer thereunder is visible. By undergoing the mask processing when read from the original image 690, the white part is saved as transparent data (transparent dots), and a part other than white (part expressed by black dots) is saved as a mask pattern. A mask part has a color designated as a default color of blue, but the color can be changed to the user's favorite color depending on the user's preference.

On the other hand, when the part made to be transparent by the mask processing is displayed in the target region, the enlarged/reduced original image 620 obtained by subjecting the original image 690 to the enlargement/reduction processing, which is displayed under the transparent part, is seen therethrough. However, in order to let the user recognize that the enlarged/reduced original image 620 is being seen through the transparent part, it is possible for the user to designate a transparency and a color of transparent parts of the vertical/horizontal target images 700 and 710. The default transparency and color are, for example, 70% and blue.

As a result, in a case of default settings, in the target region, by displaying the mask part of the target image in blue, and displaying the transparent part of the target image in light blue when the enlarged/reduced original image 620 thereunder is white (70%, blue) and in a dark light blue when the enlarged/reduced original image 620 thereunder is black, distinction therebetween is possible.

The vertical/horizontal target images 700 and 710 are thus subjected to the mask processing, and hence, even when the vertical/horizontal target regions 532 and 533 are secured on the display screen 53, the enlarged/reduced original image 620 is inhibited from being completely hidden (that is, the display region of the enlarged/reduced original image 620 is inhibited from becoming narrow) by the enlarged/reduced vertical/horizontal target images 621 and 622.

In other words, there is an advantage that the entire display screen 53 can be used as the region for displaying the enlarged/reduced original image 620.

Note that, when the original image 690 is the vector data, after the vector data is temporarily converted into the raster data based on the attribute information, the images of the regions corresponding to the designated regions are read from the original image 690 that has been converted into the raster data, to thereby be saved as the vertical target image 700 and the horizontal target image 710.

In regard to the original image 690 in this case, the enlarged/reduced original image 620 is created from the vector data based on the enlargement/reduction ratio P and displayed on the entire display screen 53. The enlarged/reduced vertical/horizontal target images 621 and 622 to be displayed in the vertical/horizontal target regions 532 and 533 of the display screen 53 are displayed by performing the enlargement/reduction for the raster data saved in the vertical/horizontal target image storage units 70 and 71.

As described later, to display the target image on the display screen 53 along with the original image 690, the enlarged/reduced original image 620, which is obtained by performing the enlargement/reduction processing for the original image 690 by P×P times based on the converted enlargement/reduction ratio P obtained by the screen operation, is displayed on the display screen 53.

Further, the enlarged/reduced vertical target image 621, which is obtained by multiplying the vertical target image 700 of the vertical target image storage unit 70 by P in the long-side direction (vertical direction) and by S in the short-side direction, is displayed in the vertical target region, and the enlarged/reduced vertical/horizontal target images 621 and 622, which are obtained by multiplying the horizontal target image 710 of the horizontal target image storage unit 71 by P in the long-side direction (horizontal direction) and by S in the short-side direction, are displayed in a vertical/horizontal target region.

Figure 3:
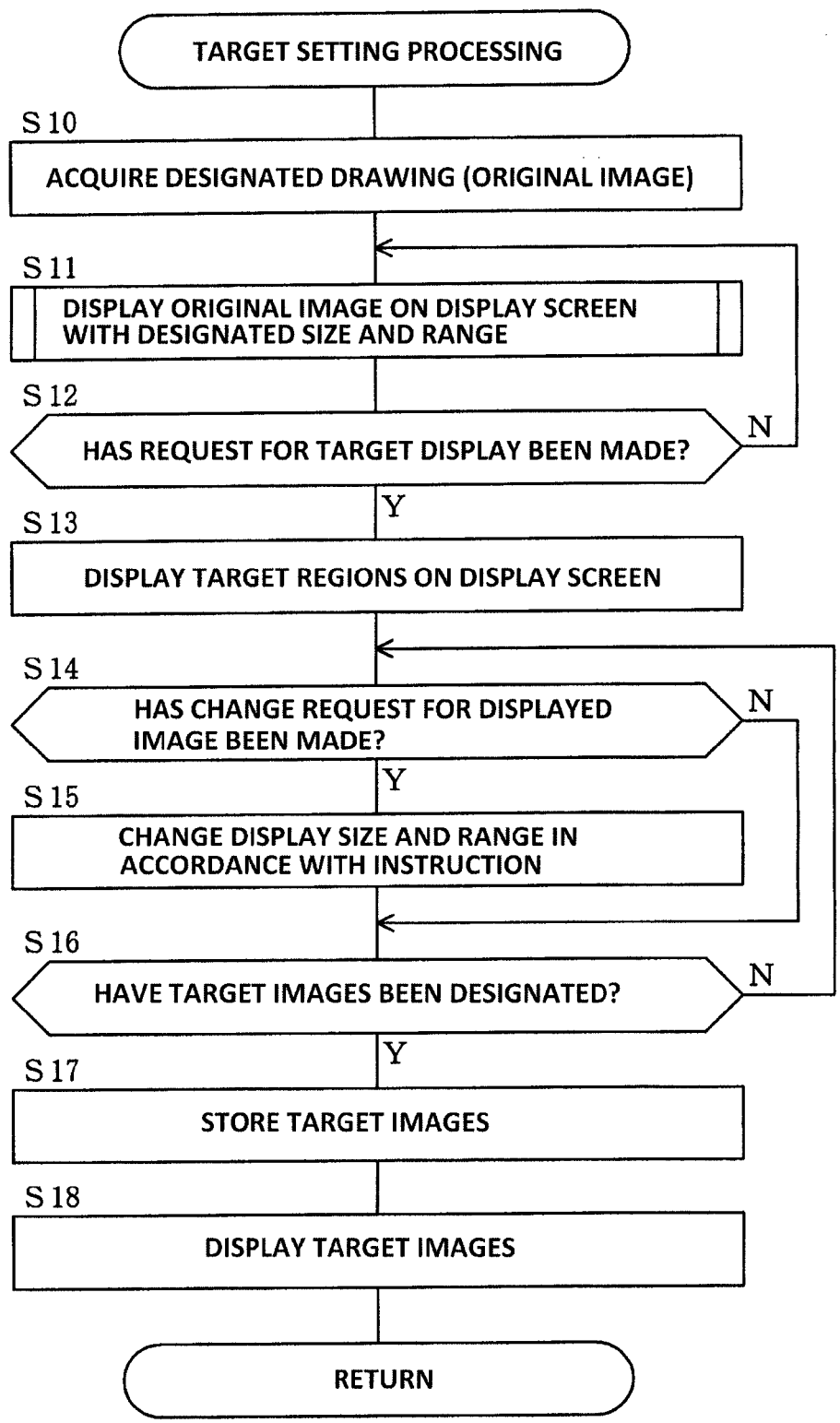
FIG. 3 is a flowchart illustrating target setting processing for setting an image of a base line number or the like as a target image.

Next, the target setting processing for fixedly displaying the image of the base line number or the like on the drawing display device having the above-mentioned configuration is described with reference to a flowchart of FIG. 3.

The CPU 51 acquires the original image 690 to be displayed by reading the drawing data of a file name designated by the user from within the drawing data saved in a file system of the drawing data storage unit 69 (Step 10).

Then, the CPU 51 displays the acquired original image 690 on the display screen 53 with the designated size and range (Step 11).

In the displaying processing, the CPU 51 first displays the entire range indicated by the original image 690 on the display screen 53, but because the size ((vertical dot count)× (horizontal dot count)) of the original image 690 is normally larger than the size of the display screen 53, the CPU 51 reduces the size of the original image 690 to such a size as to fall within the screen size of the display screen 53 both vertically and horizontally. Note that, when having a smaller size than the display screen 53, the original image 690 is displayed as it is without being enlarged.

When enlarged/reduced before being displayed on the display screen 53, the original image 690 is displayed by adjusting a vertical resolution (dpi) and a horizontal resolution (dpi) that are defined in the attribute information to both the vertical and horizontal resolutions of the display screen 53 so as to avoid a change in an aspect ratio of the original image 690.

Arbitrary various methods can be used as a method of displaying in accordance with the resolution of the display screen 53. When assuming that, for example, the resolution of the original image 690 is N dpi vertically and M dpi horizontally and the resolution of the display screen 53 is V dpi vertically and W dpi horizontally, the original image 690 or the enlarged/reduced original image 620 obtained after enlarging/reducing the original image 690 with the enlargement/reduction ratio designated by the user is displayed after being reduced to have an aspect ratio of V to W. The conversion processing can be performed by an application for displaying processing provided to a graphic form display device.

However, for the brevity of the description, this embodiment is described on the assumption that both the original image 690 and the display screen 53 have the same resolution.

The CPU 51 performs the enlargement/reduction processing for the enlarged/reduced original image 620 been displayed based on the user's pinch operation on the display screen 53 (touch panel), and further performs the movement (change in the display range) of the enlarged/reduced original image 620 based on the flick operation and the dragging operation.

FIG. 4 illustrate the display screen of the display screen 53 obtained after the user's screen operation.

As illustrated in FIG. 4(*a*), the enlarged/reduced original image 620 obtained after performing the enlargement/reduction processing for the original image 690 based on the user operation is displayed on the entire display screen 53. In other words, FIG. 4(*a*) illustrates that, after the entire original image 690 (see FIG. 2) is first displayed on the display screen 53, the user has performed the pinch-out operation for the enlargement and the dragging operation toward the bottom right direction.

Further, the target selection button 531 is displayed at the bottom right of the display screen 53. The user can tap (select) the target selection button 531 to request for target display.

The CPU 51 monitors whether or not the request for the target display has been made by the user by tapping the target selection button 531 (Step 12).

When the request for the target display is made by the user (Step 12; Y), the CPU 51 displays the vertical target region 532 having a predetermined width at the right edge of the display screen 53 and the horizontal target region 533 having a predetermined height at the bottom edge (Step 13).

FIG. 4(*b*) illustrates a screen state in which the target selection button 531 is tapped in the display state of FIG. 4(*a*).

The vertical/horizontal target regions 532 and 533 are explicitly indicated by displaying internal parts thereof in blue with the default transparency of 70% (as a result, light blue). In FIG. 4(*b*), within the enlarged/reduced original image 620 displayed on the entire display screen 53, the enlarged/reduced original image 620 included in the vertical/horizontal target regions 532 and 533 is indicated by the dotted lines, but is displayed in a dark light blue in actuality.

When the vertical/horizontal target regions 532 and 533 are displayed on the display screen 53, the user examines whether or not the two regions 532 and 533 include the image desired to be fixedly displayed as the target image within the original image 690. When the image is not included, the user changes the size and region of the enlarged/reduced original image 620 being displayed within the two regions 532 and 533 by performing the pinch operation, the dragging operation, or the like (hereinafter referred to as "screen operation").

The CPU 51 monitors whether or not a change request for a displayed image has been made by the screen operation (Step 14), and when the change request has been made (Step 14; Y), changes the display size and range of an enlarged/reduced image in accordance with an instruction (Step 15).

For example, the base line numbers are not displayed on the display screen 53 illustrated in FIG. 4(*b*).

Therefore, when the user performs the dragging operation toward the top left direction on the display screen 53, as illustrated in FIG. 5(*c*), the enlarged/reduced original image 620 moves toward the top left, and the image on the bottom right, which has not been displayed so far, is now displayed in the vertical/horizontal target regions 532 and 533.

Then, the base line numbers 692 (circled alphabet letters of A to D) in the vertical direction and the base line numbers 693 (circled numbers of 1 to 5) in the horizontal direction, which serves as the images in the desired regions, are displayed in the vertical/horizontal target regions 532 and 533. Note that, in FIG. 5(*c*), the base line numbers 692 and 693 are not being displayed as the target images, but the enlarged/reduced original image 620 is being displayed in a see-through manner, and are therefore indicated by the dotted lines.

When desired images are being displayed in the vertical/horizontal target regions 532 and 533, the user performs the tap operation within the vertical/horizontal target regions 532 and 533 to designate the target images, while the CPU 51 monitors whether or not the designation has been performed by the tap operation (Step 16).

Note that, the user's designation of (tapping on) the target image can be performed for each of the vertical target region 532 and the horizontal target region 533 to designate only one thereof.

To designate both, after one is designated, the display size and range of the displayed image may be changed (Step 15) before the other is designated, and then the other may be designated.

When the target images are designated (Step 16; Y), the CPU 51 reads the target images corresponding to the designated ranges from the original image 690 of the drawing data storage unit 69, and stores the target images into the vertical target image storage unit 70 and the horizontal target image storage unit 71 by setting the white part as the transparent data and the part other than white as the mask pattern in the above-mentioned mask processing (Step 17).

Note that, the CPU 51 saves the enlargement/reduction ratio S of the enlarged/reduced original image 620 displayed on the display screen 53 at a time when the target images are designated (Step 16; Y) with respect to the original image 690 to the RAM 62.

Figure 6:
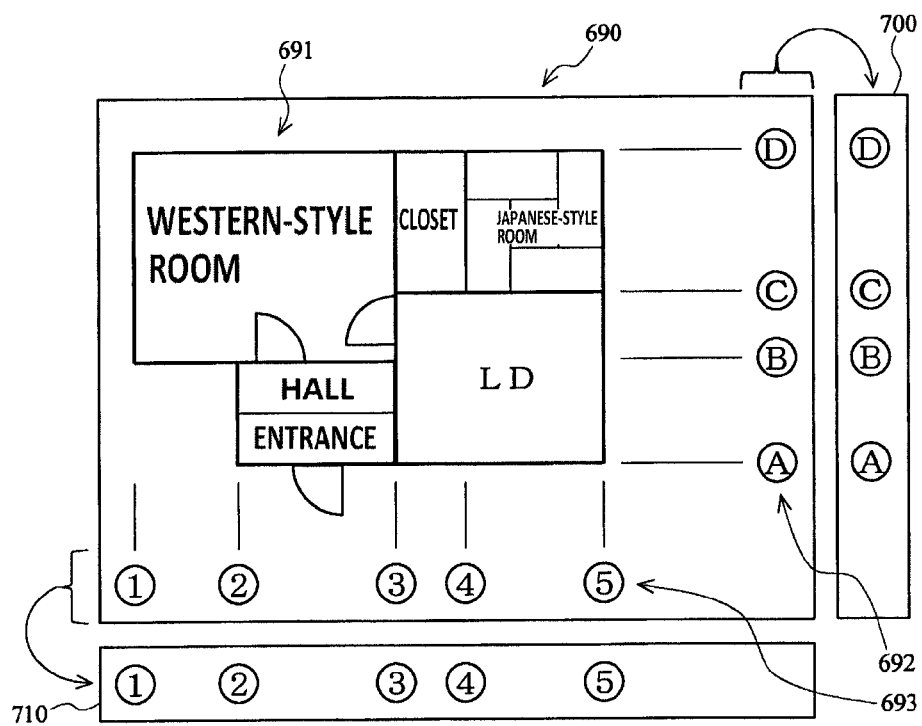
FIG. 6 illustrates ranges of a vertical target image and a horizontal target image, which are stored from the original image.

FIG. 6 illustrates the ranges to be stored in the vertical target image storage unit 70 and the horizontal target image storage unit 71 within the original image 690.

In FIG. 6, the original image 690 is the same as the original image 690 illustrated in FIG. 2.

In Step 17, the CPU 51 reads the image of the region corresponding to the enlarged/reduced original image 620 (see FIG. 5(*c*)), which is transparently displayed in the vertical target region 532 of the display screen 53, from the original image 690, and stores the image into the vertical target image storage unit 70 after the mask processing.

Further, the CPU 51 reads the image of the region corresponding to the enlarged/reduced original image 620, which is transparently displayed in the horizontal target region 533 of the display screen 53, from the original image 690, and stores the image into the horizontal target image storage unit 71 after the mask processing.

Note that, in this embodiment, as illustrated in FIG. 6, the region read from the original image 690 and stored into the vertical target image storage unit 70 corresponds to a range displayed in the vertical target region 532 in the horizontal direction (short-side direction) and to a range (range longer than the display range) that extends over the entire long-side direction (vertical direction) of the vertical target region 532 in the vertical direction (long-side direction).

In other words, the enlarged/reduced original image 620 displayed in the vertical target region 532 of FIG. 5(*c*) is the base line numbers of A to C, while the base line numbers stored in the vertical target image storage unit 70 are all of A to D as illustrated in FIG. 6.

In the same manner, the region read from the original image 690 and stored into the horizontal target image storage unit 71 corresponds to a range displayed in the horizontal target region 532 in the vertical direction (short-side direction) and to a range that extends over the entire long-side direction (vertical direction) of the horizontal target region 532 in the horizontal direction (long-side direction).

By thus storing the range that extends to the entire original image 690 in the long-side direction of the vertical/horizontal target regions 532 and 533, it is possible to save all the base line numbers (A to D and 1 to 5) displayed along the long-side direction (both vertical and horizontal directions). Further, follow-up display is made possible in the long-side direction so as to correspond to the entire range of the enlarged/reduced original image 620 displayed on the display screen 53.

Figure 5C:
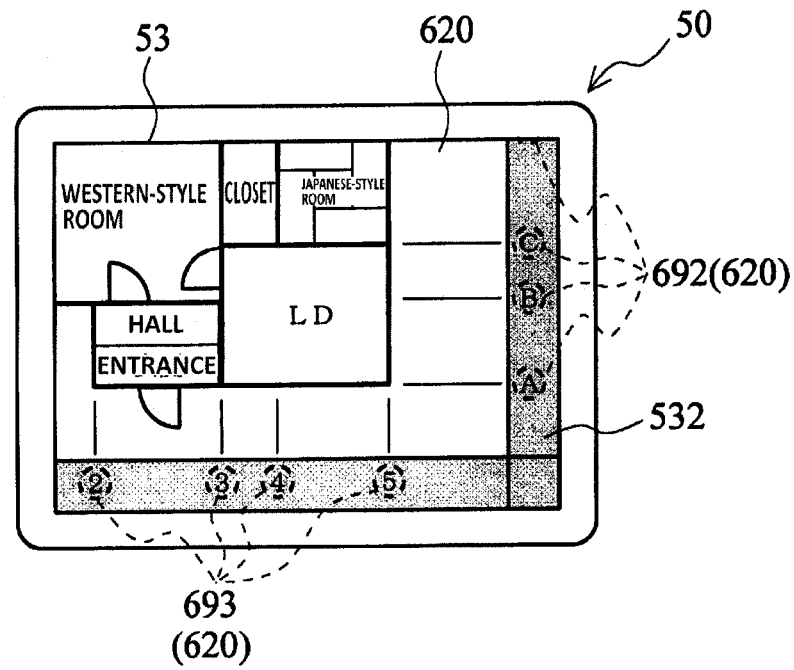
FIG. 5 are explanatory diagrams illustrating the display screens obtained before and after the target image is set.
Figure 5D:
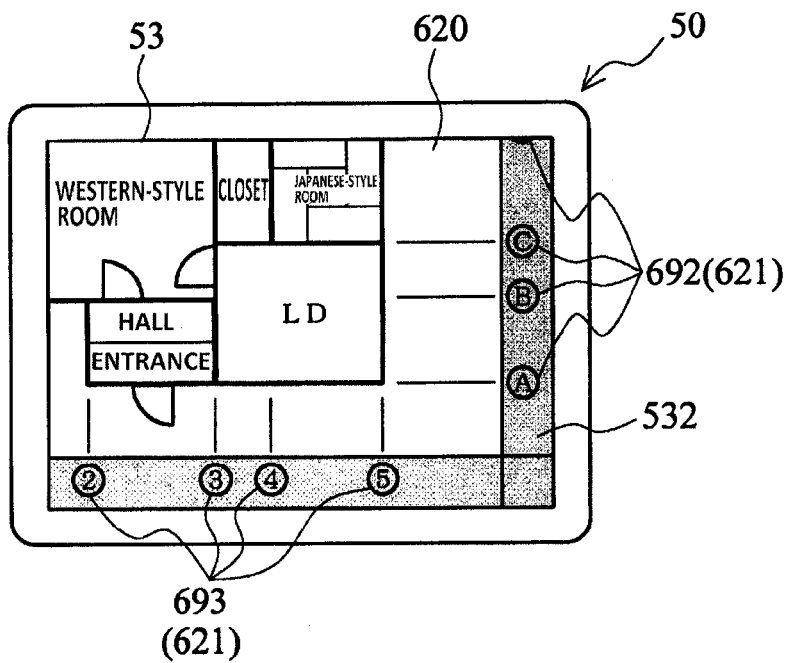

Subsequently, as illustrated in FIG. 5(d), the CPU 51 displays the stored vertical/horizontal target images 700 and 710 in the vertical/horizontal target regions 532 and 533 of the display screen 53 (Step 18).

Displayed in the vertical/horizontal target regions 532 and 533 are the enlarged/reduced vertical/horizontal target images 621 and 622 obtained by performing the enlargement/reduction for the two images stored in the vertical/horizontal target image storage units 70 and 71.

As a result, before the target image is designated in Step 16, as illustrated in FIG. 5(c), the base line numbers 692 and 693 are displayed as transparent images of the enlarged/reduced original image 620 (indicated by the dotted lines in FIG. 5(c)), while the enlarged/reduced vertical/horizontal target images 621 and 622 are displayed in blue set as the default color of the mask part (indicated by the solid lines in FIG. 5(d)).

Note that, enlargement/reduction processing and the display range in a case where the enlarged/reduced vertical/horizontal target images 621 and 622 are displayed in the vertical/horizontal target regions 532 and 533 are described in regard to the target follow-up processing later.

Subsequently to the target setting processing described above, the CPU 51 displays the enlarged/reduced original image 620 subjected to the movement (change in the display range) and the enlargement/reduction in accordance with the user's screen operation on the display screen 53, and also displays the enlarged/reduced vertical/horizontal target images 621 and 622, which are caused to follow up the movement and the enlargement/reduction of the enlarged/reduced original image 620 along the long-side direction, in the vertical/horizontal target regions 532 and 533.

Figure 7:
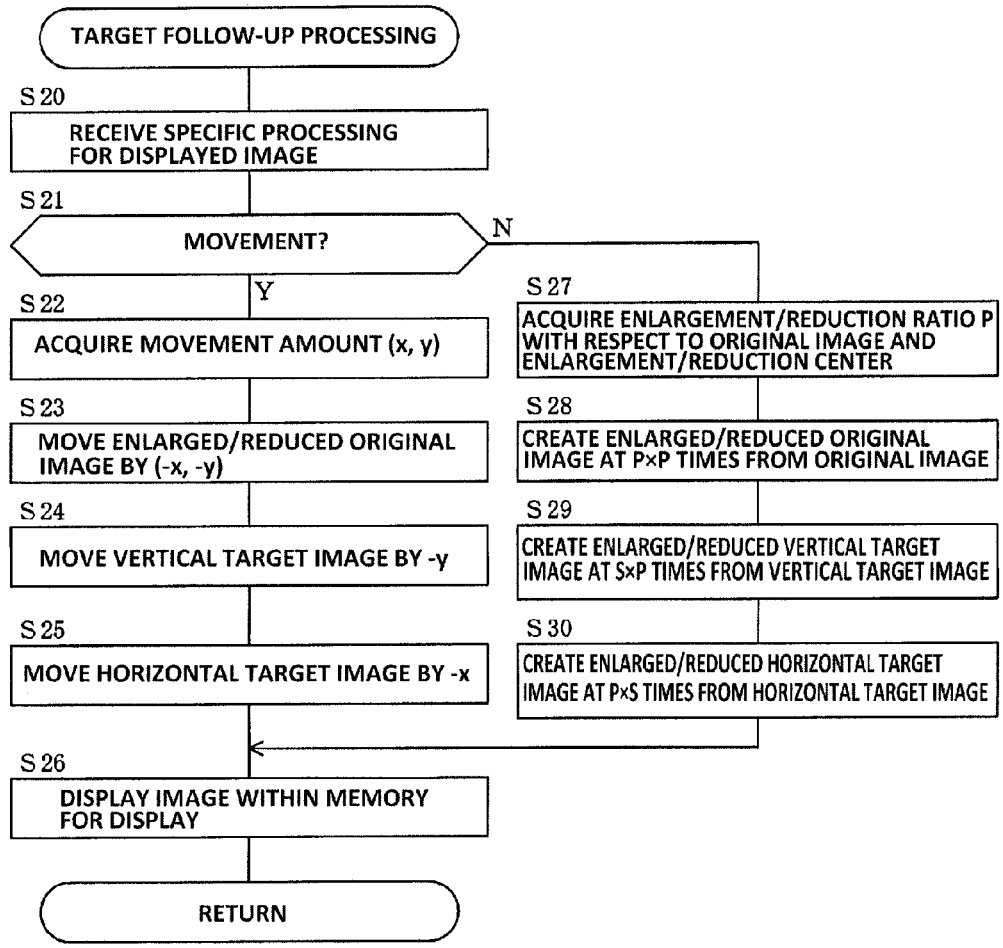
FIG. 7 is a flowchart illustrating follow-up processing for enlarged/reduced vertical/horizontal target images.

FIG. 7 is a flowchart illustrating the follow-up processing for the enlarged/reduced vertical/horizontal target images 621 and 622.

Note that, the follow-up processing is described with reference to a screen transition from the state of the display screen 53 of FIG. 5(d).

The CPU 51 receives specific processing performed by the user on the display screen 53 (Step 20). The specific processing includes the dragging operation and the flick operation for image movement and the pinch operation for image enlargement/reduction which are performed on the display screen 53.

The CPU 51 determines whether or not the received specific processing is the movement (Step 21).

When the specific processing is the movement based on the dragging operation (Step 21; Y), the CPU 51 acquires the movement amount (x, y) in the horizontal direction and the vertical direction based on the dragging operation or the flick operation (Step 22).

In the case of the dragging operation, the CPU 51 obtains the movement amount (x, y) from two coordinate values of a position at which the screen is touched by the finger or the like and a position of the release after the movement. Further, in the case of the flick operation, the CPU 51 obtains the movement amount (x, y) from a direction (anyone of directions of up, down, left, right, and diagonal directions therebetween) of a flipping operation and a strength thereof.

In the case of the movement, there is no need to change the enlargement/reduction ratio of the image displayed on the display screen 53, and hence the CPU 51 moves the enlarged/reduced original image 620 by (-x, -y) (Step 23).

In other words, the CPU 51 reads a range that has moved from the current display range by -x in the horizontal direction and by -y in the vertical direction within the enlarged/reduced original image 620 stored in the RAM 62, and writes the range to the memory 64 for display (Step 23).

Further, the CPU 51 reads a range that has moved from the current display range by -y in the vertical direction (long-side direction) within the enlarged/reduced vertical target image 621 stored in the RAM 62, and writes the range to the region corresponding to the vertical target region 532 of the memory 64 for display (Step 24).

Further, the CPU 51 reads a range that has moved from the current display range by -x in the horizontal direction (long-side direction) within the enlarged/reduced horizontal target image 622 stored in the RAM 62, and writes the range to the region corresponding to the horizontal target region 533 of the memory 64 for display (Step 25).

Note that, as long as the enlarged/reduced original image 620 has been written, any one of the enlarged/reduced vertical/horizontal target images 621 and 622 may be first written to the memory 64 for display.

By writing the enlarged/reduced original image 620 and the enlarged/reduced vertical/horizontal target images 621 and 622 to the memory 64 for display, the newly written image is displayed on the display screen 53 (Step 26).

FIG. 8 (e) illustrates an image display state of the display screen 53 obtained after movement processing.

In other words, FIG. 8(e) illustrates the image obtained after the user performs the dragging operation toward the bottom right direction in the region in which only the enlarged/reduced original image 620 is displayed by the user by using the finger or the like on the display screen 53 (screen after the target setting processing) before the movement as illustrated in FIG. 5(d).

The CPU 51 acquires the movement amount (x (right), y (down)) from the dragging operation toward the bottom right direction, reads a region shifted from the enlarged/reduced original image 620 within the region displayed in FIG. 5(d) by (-x (left), -y (up)), and writes the region to the memory 64 for display. With this configuration, as illustrated in FIG. 8(e), an entire housing drawing is displayed on the display screen 53 within the enlarged/reduced original image 620. In this case, the base lines that do not exist in the vertical/horizontal target regions 532 and 533 in the state of FIG. 5(d) are transparently displayed in the regions 532 and 533. However, FIG. 8(e) does not illustrate the portions of the base lines overlapping with the mask parts (base line numbers 692 and 693) of the enlarged/reduced vertical/horizontal target images 621 and 622.

Then, the CPU 51 reads the region shifted by -y (up) from the enlarged/reduced vertical target image 621 within the region displayed in the vertical target region 532, and overwrite the region to the memory 64 for display.

With this configuration, the vertical enlarged/reduced target image 621 that follows up the enlarged/reduced original image 620 while maintaining a positional relationship therewith in the vertical direction is displayed in the vertical target region 532. In FIG. 5(d), only the base lines of A to C are displayed, while in FIG. 8(e) after the movement processing, the base lines of A to D are displayed.

Further, the CPU 51 reads the region shifted by −x (left) from the enlarged/reduced vertical target image 622 within the region displayed in the horizontal target region 533, and overwrite the region to the memory 64 for display.

With this configuration, the horizontal enlarged/reduced target image 622 that follows up the enlarged/reduced original image 620 while maintaining a positional relationship therewith in the horizontal direction is displayed in the horizontal vertical target region 533. In FIG. 5(d), only the base lines of 2 to 5 are displayed, while in FIG. 8(e) after the movement processing, the base lines of 1 to 5 are displayed.

As described above, by the movement processing according to this embodiment, as illustrated in the screen transition from FIG. 5(d) to FIG. 8(e), the enlarged/reduced vertical target image 621 moves along an up-down direction so as to follow up the movement in the up-down direction (vertical direction) of the enlarged/reduced original image 620 while maintaining a positional relationship with the enlarged/reduced original image 620.

Further, the enlarged/reduced horizontal target image 622 moves in the left-right direction so as to follow up the movement in a left-right direction (horizontal direction) of the enlarged/reduced original image 620 while maintaining a positional relationship with the enlarged/reduced original image 620.

With this configuration, it is possible to constantly confirm the base line number (image set as the target) corresponding to the enlarged/reduced original image 620 displayed on the display screen 53.

On the other hand, when the specific processing received in Step 20 is not the movement but the enlargement/reduction processing based on the pinch operation (Step 21), the CPU 51 acquires the enlargement/reduction ratio P with respect to the original image 690 and an enlargement/reduction center based on the pinch operation (Step 27).

In other words, the CPU 51 acquires the center between the coordinates of the positions of the two fingers or the like first brought into close contact with the screen in the pinch operation as the enlargement/reduction center.

In addition, the CPU 51 acquires the enlargement/reduction ratio Q with reference to the enlarged/reduced original image 620 displayed before the operation from the movement amount of the finger or the like based on the pinch operation. When the enlargement/reduction ratio of the enlarged/reduced original image 620 displayed before the operation with reference to the original image 690 is R, the CPU 51 acquires the enlargement/reduction ratio P=Q×R after the pinch operation with reference to the original image 690, and creates the enlarged/reduced original image 620 by P×P times.

For example, in a state in which the enlarged/reduced original image 620 having the enlargement/reduction ratio R=0.25 per side with respect to the original image 690 is displayed, when the enlargement/reduction ratio Q=2 is acquired by the pinch operation, the CPU 51 creates the enlarged/reduced original image 620 having the enlargement/reduction ratio P=0.5(=0.25×2).

In this manner, the enlargement/reduction ratio Q acquired by the pinch operation is the enlargement/reduction ratio with reference to the enlarged/reduced image 620 before the operation displayed on the display screen 53, and hence, by converting the enlargement/reduction ratio Q into the enlargement/reduction ratio P with reference to the original image 690 to create the enlarged/reduced image 620, it is possible to prevent accumulation of pixel losses due to an enlargement/reduction operation.

Subsequently, the CPU 51 creates the enlarged/reduced original image 620 by P×P times from the original image 690 based on the acquired enlargement/reduction ratio P, and writes the enlarged/reduced original image 620 having the acquired enlargement/reduction center as a center with respect to the pinch operation to the memory 64 for display (Step 28).

In addition, the CPU 51 creates the enlarged/reduced vertical target image 621 by S times in the horizontal direction and P times in the vertical direction (long-side direction) from the vertical target image 700, reads the same range in the vertical direction as the enlarged/reduced original image 620, and writes the range to a corresponding portion of the memory 64 for display (Step 29).

In addition, the CPU 51 creates the enlarged/reduced horizontal target image 622 by P times in the horizontal direction (long-side direction) and S times in the vertical direction from the horizontal target image 71, reads the same range in the horizontal direction as the enlarged/reduced original image 620, and writes the range to a corresponding portion of the memory 64 for display (Step 30).

Note that, the enlargement/reduction ratio S is the enlargement/reduction ratio with respect to the original image 690 of the enlarged/reduced original image 620 displayed on the display screen 53 at a time (Step 16; Y) when the target image is designated in the target setting processing as described above. As the enlargement/reduction ratio S in the short-side direction, a constant value in the enlargement/reduction processing, in other words, the enlargement/reduction ratio S fixed constantly irrespective of the converted enlargement/reduction ratio P is used.

With this configuration, in the short-side direction of the vertical/horizontal target regions 532 and 533, the enlarged/reduced vertical/horizontal target images 621 and 622 constantly having the same size as the image displayed when the target is set are displayed, and the enlargement/reduction is performed only in the long-side direction.

By thus writing the enlarged/reduced original image 620 and the enlarged/reduced vertical/horizontal target images 621 and 622 to the memory 64 for display, the newly written image is displayed on the display screen 53 (Step 26).

FIG. 8(f) illustrates the displayed image of the display screen 53 obtained after the enlargement/reduction processing is performed for the display screen of FIG. 8(e).

FIG. 8(f) illustrates a screen obtained after the enlarged/reduced original image 620 displayed on the display screen 53 illustrated in FIG. 8(e) is subjected to the pinch-out operation with a lower left part of the Japanese character "和 (wa) " used as the enlargement/reduction center and subjected to the enlargement/reduction processing with the enlargement/reduction ratio Q=2.5 times per side with reference to the enlarged/reduced original image 620 before the enlargement/reduction.

With this configuration, the region using the enlargement/reduction center (lower left part of the Japanese character "和 (wa) ") as a center of the display region within the enlarged/reduced original image 620 created from the original image 690 with the enlargement/reduction ratio P (converted from the enlargement/reduction ratio Q) is displayed on the display screen 53 illustrated in FIG. 8(f).

On the other hand, in the vertical/horizontal target regions 532 and 533, the vertical/horizontal target images 700 and 710 are subjected to the enlargement/reduction processing so as to have the same enlargement/reduction ratio P as the enlarged/reduced original image 620 in the long-side direction or the fixed enlargement/reduction ratio S in the short-side direction, and thus the enlarged/reduced vertical/horizontal target images 621 and 622 having the same range as the display range of the enlarged/reduced original image 620 are displayed in the long-side direction.

Note that, in the short-side direction of the enlargement/reduction ratio S, a width size of each of the enlarged/reduced vertical/horizontal target images 621 and 622 matches that of each of the vertical/horizontal target regions 532 and 533, and hence the entire range of each of the images is displayed as it is.

In this manner, in the short-side direction of the vertical/horizontal target regions 532 and 533, the enlarged/reduced vertical/horizontal target images 621 and 622 constantly having the same size as the image displayed when the target is set are displayed, and the enlargement/reduction is performed only in the long-side direction.

In other words, the enlarged/reduced vertical/horizontal target images 621 and 622 by one time (without the enlargement/reduction) in the short-side direction and by Q times (by the pinch operation) in the long-side direction are displayed with reference to the enlarged/reduced vertical/horizontal target images 621 and 622 displayed in the vertical/horizontal target regions 532 and 533 when the target is set (see Step 18).

As a result, in FIG. 8(*f*), compared to the image obtained when the target is set (see FIG. 5(*d*)) and the image obtained before the enlargement/reduction (see FIG. 8(*e*)), the base line numbers A to D (C and part of D of those) displayed in the vertical/horizontal target regions 532 and 533 are displayed to be vertically stretched (by Q times), and the base line numbers 1 to 5 (3 to 5 of those) are displayed to be horizontally stretched (by Q times). With this configuration, even in the short-side direction having a short length (size) of the display region, it is possible to prevent the image (image of the base line number in the embodiment) from overflowing from the region (causing a lack) by enlargement processing and being unable to be read.

Note that, in the vertical target region 532 of FIG. 8(*f*), the wall surface line 695 corresponding to the base line number "5", which is a part of the enlarged/reduced original image 620, is displayed transparently (displayed as a dotted line).

Further, in an overlapping region 534 the bottom right in which the vertical target region 532 and the horizontal target region 533 overlap each other, the base line number "5" included in the enlarged/reduced horizontal target image 622 is displayed in the default color (blue in the described embodiment) as the mask pattern. In this embodiment, in the overlapping region 534, the mask patterns of the enlarged/reduced vertical/horizontal target images 621 and 622 are displayed together, but characters may be hard to recognize due to an overlap, and hence any one thereof may be displayed while the other may be inhibited from being displayed. In this case, for example, the enlarged/reduced horizontal target image 622 may be displayed as default, and the display may be switched to the display of the enlarged/reduced vertical target image 621 in accordance with the user operation (for example, processing for tapping the vertical target region 532 except an overlapping region). Further, the switching may be performed each time the tap operation is performed in the overlapping region 534.

In this manner, in this embodiment, the enlarged/reduced original image 620 is created from the original image 690, while the enlarged/reduced vertical/horizontal target images 621 and 622 are created from the vertical/horizontal target images 700 and 710 provided as different images from the original image 690.

Accordingly, it is possible to create the enlarged/reduced vertical/horizontal target images 621 and 622 having different enlargement/reduction ratios between the long-side direction and the short-side direction.

In addition, the vertical/horizontal target images 700 and 710 are stored separately from the original image 690, and hence it is possible to use a common enlargement/reduction display program, which allows the program to be simple.

In other words, there exist various enlargement/reduction display programs for displaying the designated range in a designated screen region with the designated enlargement/reduction ratio based on a given image, and hence the same enlargement/reduction display program can be used as it is for the original image 690 and the vertical/horizontal target images 700 and 710. The CPU 51 can perform the target follow-up processing according to this embodiment by applying the enlargement/reduction ratio (P×P for the original image 690 and S×P and P×S for the vertical/horizontal target images) in the short-side direction and the long-side direction, a reading range, and the screen region to the same enlargement/reduction display program as parameters thereof.

The description of embodiment is made above by taking the case where the original image 690 is the raster data, but a description is made of a case where the original image 690 is the vector data.

When the original image 690 is the vector data, each time the movement or the enlargement/reduction operation is performed on the screen of the display screen 53, the enlarged/reduced original image 620 is written from the original image 690 directly to the memory 64 for display, to thereby display the enlarged/reduced original image 620 on the display screen 53. However, the enlarged/reduced original image 620 may be created in the RAM 620 and may be written to the memory 54 for display.

On the other hand, in regard to the vertical/horizontal target images 700 and 710, when the target image is designated (Step 16; Y), the raster data having a predetermined resolution (150 dpi in the same case as the above-mentioned case of the raster data, but another resolution may be used and can be designated by the user) is created and set as the original image 690, and in the same manner as described in Step 17, the vertical/horizontal target images 700 and 710 (raster data) are saved to the vertical/horizontal target image storage units 70 and 71.

After that, the enlarged/reduced vertical/horizontal target images 621 and 622 are created in the same manner as described in the target follow-up processing of FIG. 7.

Figure 9:
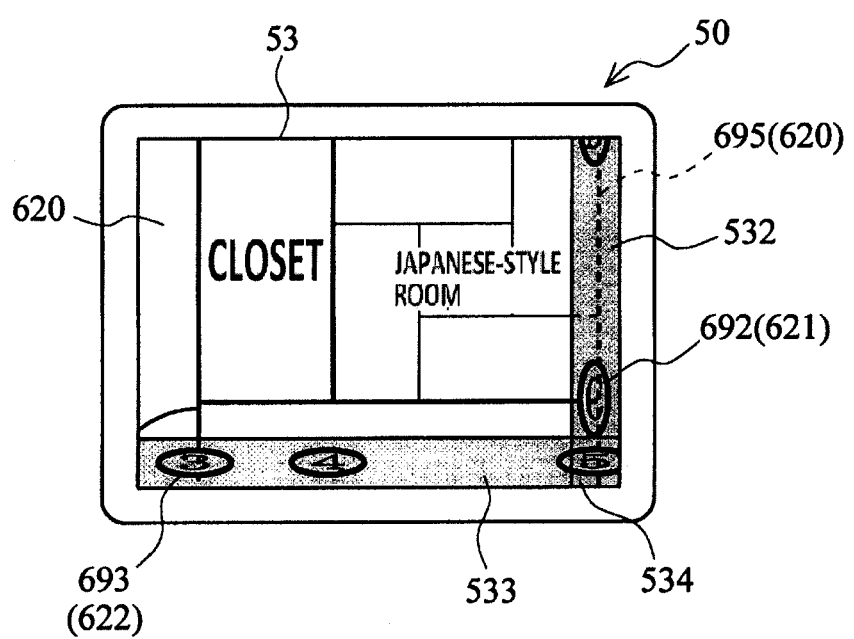
FIG. 9 is an explanatory diagram illustrating the display screen obtained after the enlargement/reduction processing in a case where the original image is vector data.

FIG. 9 illustrates the image obtained by subjecting the vector data serving as the original image 690 to the enlargement/reduction processing in the target follow-up processing.

In FIG. 9, the original image 690 is the vector data, and hence the enlarged/reduced original image 620 to be displayed on the display screen 53 is drawn and displayed by a line having a designated thickness irrespective of the enlargement/reduction ratio. This is understood by being compared to FIG. 8(*f*) that illustrates the same state as FIG. 9 with the original image 690 set as the raster data.

In this manner, a line segment or the like is constantly displayed with a designated fixed thickness, and hence a good-looking linear image can be displayed even on the drawing display device 50 such as a smartphone (multifunctional cellular phone) and a cellular phone having a relatively small display screen 53.

Further, the drawing display device 50 according to this embodiment displays a large drawing such as the architectural drawing whose size at the time of printing is the A0 or A1 size on a screen having a size equal to or smaller than approximately the A4 size, or on a smaller screen of a cellular phone or the like in some cases. Thus, the drawing display device 50 is basically premised on frequent repetitions of the enlargement/reduction operation. In other words, by reducing the drawing to display the entire drawing and displaying the drawing after enlarging the drawing from the entire drawing to substantially the same size as used at the time of printing (reduction from the original image 690), a small size of the display screen 53 is covered, and a merit of portability is made the most of.

Accordingly, when the original image 690 is the vector data, it is possible to reduce the load imposed on data processing due to the repetition of the enlargement/reduction processing.

Further, the enlarged/reduced original image 620 is created from the original image 690 of the vector data, while the enlarged/reduced vertical/horizontal target images 621 and 622 are created from the vertical/horizontal target images 700 and 710 of the raster data.

Accordingly, as illustrated in FIG. 9, unlike the enlarged/reduced original image 620 drawn with a fixed thickness irrespective of the enlargement/reduction ratio, the enlarged/reduced vertical/horizontal target images 621 and 622 have the thicknesses of the base line numbers changed by being subjected to the enlargement/reduction in the long-side direction in accordance with the enlargement/reduction ratio (enlargement/reduction ratio Q).

However, compared to the size of the display screen 53, the vertical/horizontal target regions 532 and 533 have a small size (for example, approximately $1/10$ to $1/20$) (smaller than the vertical/horizontal target images 700 and 710 of the raster data), and can therefore be subjected to higher speed processing than a case of being handled as the vector data.

The embodiment of the present invention has been described above, but the present invention is not limited thereto, and various modifications can be made.

For example, the description of the described embodiment is directed to the case where the vertical/horizontal target regions 532 and 533 are displayed fixedly at the right edge and the bottom edge, respectively, of the display screen 53, but the vertical/horizontal target regions 532 and 533 may be set movable.

Figure 10A:
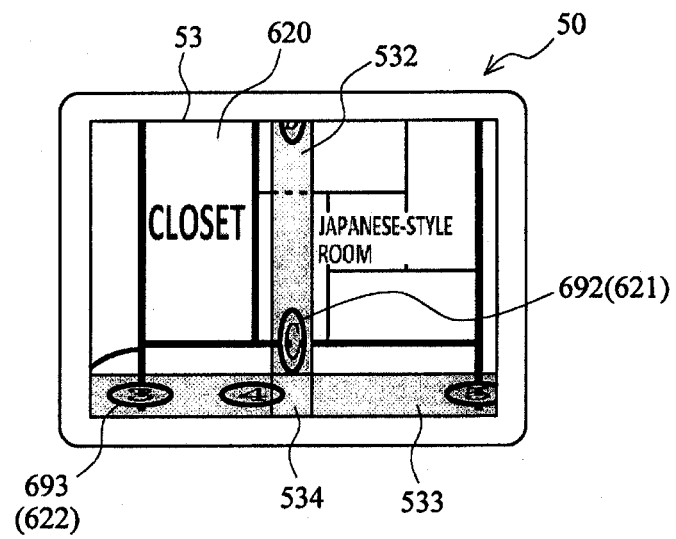
FIG. 10 are explanatory diagrams illustrating the display screens of a drawing display device according to a modification example.

FIG. 10(a) illustrates a state in which the vertical target region 532 has been moved to the center of the screen from the right edge of the display screen 53.

In order to perform the movement, the internal part of the vertical target region 532 is touched by the finger or the like, and the dragging operation is performed horizontally to a desired position without a release. Further, the internal part of the horizontal target region 533 is touched by the finger or the like, and the dragging operation is performed in the up-down direction to a desired position without a release.

The CPU 51 moves the vertical/horizontal target regions 532 and 533 to a dragging stop position.

By thus allowing the movement of the vertical/horizontal target regions 532 and 533 in the short-side direction, the following effects can be obtained.

In other words, when the vertical/horizontal target regions 532 and 533 are fixed to the edge parts, it may be hard to grasp the position (for example, position corresponding to the base line number) of the enlarged/reduced original image 620 displayed at the edge part on the other side. In contrast, by using a movement function in the short-side direction to move the vertical/horizontal target regions 532 and 533, it is possible to compare and confirm an image section part to be confirmed and the enlarged/reduced vertical/horizontal target images 621 and 622 in close proximity to each other (within the regions 532 and 533 depending on a movement position).

Further, as illustrated in FIG. 10(a), by having the vertical/horizontal target regions 532 and 533 moved to the proximity of the center or the like of the display screen 53, it is easy to confirm correspondences (identify positions in the case of the base line numbers) over the entire drawing (enlarged/reduced original image 620) displayed on the display screen 53.

Further, the movement of the vertical/horizontal target regions 532 and 533 by the dragging operation can be performed not only in the above-mentioned target follow-up processing but also in the target setting processing.

In other words, in the target setting processing, the image (enlarged/reduced original image 620) desired to be set as the target image needs to fall within the vertical/horizontal target regions 532 and 533, but the description of the embodiment is directed to the case where the enlarged/reduced original image 620 is moved.

In contrast, by the dragging operation, the vertical/horizontal target regions 532 and 533 may be moved to a position at which the desired image falls within the vertical/horizontal target regions 532 and 533.

Further, the description of the embodiment is directed to the case where the vertical/horizontal target regions 532 and 533 are displayed at the right edge and the bottom edge when the target selection button 531 (see FIG. 4) is selected, but the display may be performed in other matters as follows.

(1) When the target selection button 531 is selected, the display is performed at the left edge and the upper edge.

(2) The display is performed at the right edge and the bottom edge in accordance with a selection of the target selection button 531, and the display positions are switched to the left edge and the upper edge in accordance with the subsequent selection of the target selection button 531 (or overlapping region 534), after which the display positions are switched for each selection.

(3) When the target selection button 531 is selected, the display is performed in four portions of the right edge, the left edge, the upper edge, and the bottom edge, and when tap processing is performed for a desired region, the target image of the region is set (Step 16; Y).

Further, in the described embodiment and the above-mentioned modification example, the vertical/horizontal target regions 532 and 533 have a fixed size, but it may be possible to change the size (in particular, size in the short-side direction).

The sizes of the vertical/horizontal target regions 532 and 533 are changed by, in the target setting processing, dragging the edge part in the short-side direction of the vertical/horizontal target regions 532 and 533 displayed when the target selection button 531 is selected. In the case where the vertical/horizontal target regions 532 and 533 have been moved to the proximity of the center from the edge parts of the display screen 53 in the above-mentioned modification example, the region can be widened or narrowed on both horizontal edge sides or vertical edge sides.

The CPU 51A widens the region to a dragged position toward the center side or the edge part side.

Note that, not only in the target setting processing but also in the target follow-up processing, in the same manner as described above, the region edge parts of the vertical/horizontal target regions 532 and 533 may be able to be changed by being dragged.

In this case, the CPU 51 newly creates the vertical/horizontal target images 700 and 710 corresponding to the regions after the dragging with the enlargement/reduction ratio used immediately before the dragging processing is performed in the same manner as in the processing of Step 17 in the target setting processing.

In addition, to set the target image, the user may designate a rectangular region having an arbitrary size in an arbitrary position on the screen of the display screen 53.

The user performs designation (tap operation) for two points at diagonally-opposite angles of the rectangular region including the desired image on the display screen 53.

The CPU 51 sets the rectangular region having the designate two points as diagonally-opposite angles as the target region.

In this case, the long-side direction is automatically detected, and the follow-up is automatically performed in the long-side direction.

However, the user may designate a follow-up direction, and in this case, the short-side direction can be designated as the follow-up direction.

Further, the target region does not need to be a rectangular region, and may have a circular shape, an ellipse shape, or an arbitrary polygon. In the case of the circular shape, for example, a circular shape that passes the second point is set with a first designated point as the center. For the polygon having an arbitrary shape, two or more points are designated. When the shape of the target region is determined by being selected from among various graphic forms by the user, the shape is selected in advance, and position designation for the region is performed.

When the target region is not a rectangle, the long-side direction and the short-side direction cannot be distinguished from each other, and hence the user designates the follow-up direction.

Further, with only an enlargement/reduction size allowed to be followed up, the position may be fixed (center of the enlargement/reduction is fixed). In this case, irrespective of the display region of the drawing displayed as the enlarged/reduced original image 620, an enlargement/reduction target image using the same location as the center is constantly displayed. Accordingly, irrespective of the movement processing (Steps 21 to 26) for the enlarged/reduced original image 620, the enlargement/reduction target image keeps being displayed in the same manner without a movement.

The description of the embodiment is directed to the case of displaying the enlarged/reduced vertical/horizontal target images 621 and 622 obtained by enlarging/reducing the vertical/horizontal target images 700 and 710 with the enlargement/reduction ratio S in the short-side direction and the enlargement/reduction ratio P in the long-side direction with respect to the enlargement/reduction ratio P of the enlarged/reduced original image 620 to the original image 690.

Figure 10B:
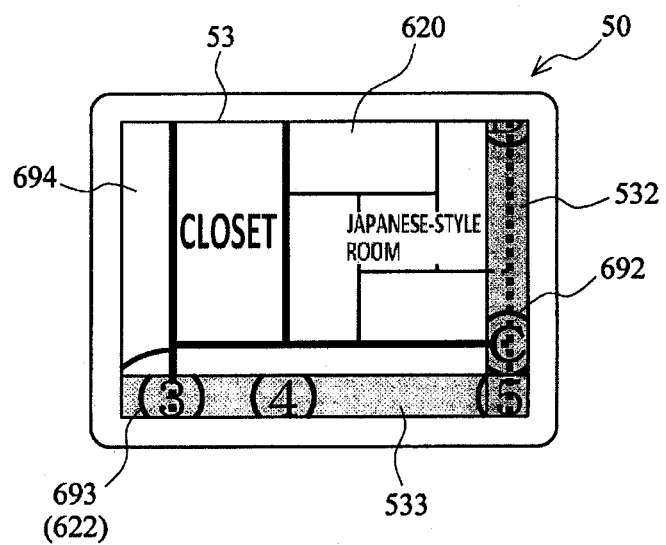

In contrast, as illustrated in FIG. 10(*b*), the enlarged/reduced vertical/horizontal target images 621 and 622 may be displayed with the enlargement/reduction ratio P in both the long-side direction and the short-side direction. In this case, in the same manner as in the described embodiment, the movement that follows up the enlarged/reduced original image 620 is not performed in the short-side direction, but the display is performed so that the centers in the short-side direction of the enlarged/reduced vertical/horizontal target images 621 and 622 matches the centers in the short-side direction of the vertical/horizontal target regions 532 and 533.

According to this modification example, as illustrated in FIG. 10(*b*), the image in the short-side direction is cut when the enlargement processing is performed, but the enlargement/reduction ratio is the same in the vertical/horizontal directions, and hence it is possible to reduce the load imposed on the processing performed for the vertical/horizontal target images 700 and 710.

Further, the description of the target setting processing according to the described embodiment is directed to the case where, when the target selection button 531 is selected as illustrated in FIGS. 4(*a*) and 4(*b*), the vertical/horizontal target regions 532 and 533 are displayed without changing the enlarged/reduced original image 620 displayed before the selection.

Figure 11:
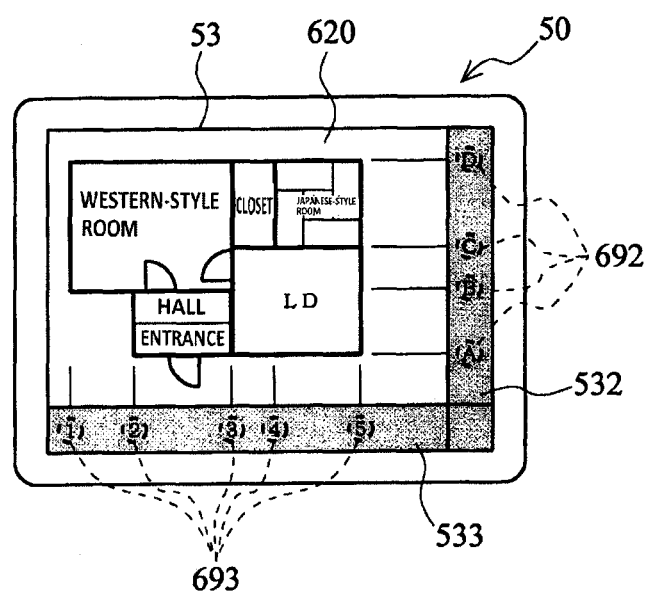
FIG. 11 is an explanatory diagram illustrating the display screen obtained after a target selection button is selected on the drawing display device according to the modification example.

In contrast, as illustrated in FIG. 11, the entire original image 690 may be constantly displayed on the display screen 53 irrespective,of the display state (enlargement/reduction ratio) of the enlarged/reduced original image 620 displayed before the target selection button 531 is selected.

According to the embodiment and the respective modification examples that have been described above, the following effects can be obtained.

(1) The vertical/horizontal target images 700 and 710 are saved separately from the original image 690, and hence a common program can be used to create and display the enlarged/reduced original image 620 and the enlarged/reduced vertical/horizontal target images 621 and 622 with high speed.

(2) In particular, when the original image 690 is the vector data, a good-looking linear image can be displayed with respect to an enlarged/reduced original image irrespective of the enlargement/reduction ratio, which is effective for a multifunctional telephone or the like having a particularly small display screen. Further, it is possible to reduce the load imposed on the data processing due to the repetition of the enlargement/reduction processing for the original image.

(3) Further, even when the original image 690 is the vector data, the vertical/horizontal target images 700 and 710 are saved as the raster data, and can therefore be subjected to higher speed processing than a case of being handled as the vector data. This is because the vertical/horizontal target images 700 and 710 having smaller data sizes than that of the original image 690 are to be processed.

(4) By setting the vertical/horizontal target regions 532 and 533 as rectangles, identification can be performed between the long-side direction and the short-side direction, and hence different processing (follow-up direction and enlargement/reduction) can be performed in both the directions.

(5) The enlargement/reduction is performed with the enlargement/reduction ratio P in the long-side direction and with the fixed reduction ratio S in the short-side direction, and hence the enlarged/reduced vertical/horizontal target images 621 and 622 constantly having the same width are displayed in the short-side direction of the vertical/horizontal target regions 532 and 533. With this configuration, it is possible to prevent the lacking of the image of a part overflowing in the short-side direction, which is narrow in width, of the vertical/horizontal target regions 532 and 533.

In particular, when the vertical/horizontal target images 700 and 710 include the base line numbers, it is possible to prevent the base line numbers from becoming unable to be recognized depending on the enlargement/reduction ratio.

(6) When the enlarged/reduced original image 620 is moved within the display screen 53, the enlarged/reduced vertical/horizontal target images 621 and 622 are each moved by a long-side direction movement amount component, and hence it is possible to perform the follow-up limited to the long-side direction while inhibiting the image from disappearing in the short-side direction in accordance with the movement of the enlarged/reduced original image 620.

(7) The vertical/horizontal target images 700 and 710 are read from all the ranges of the original image 690 in the respective long-side directions.

In other words, the original image 690 having a longer range in the long-side direction than the regions corresponding to the vertical/horizontal target regions 532 and 533 obtained when the target image is designated (Step 16; Y) is read.

Accordingly, even when the enlarged/reduced original image 620 displayed on the display screen 53 is moved in the long-side direction by a maximum amount (moved to be displayed to the edge), the enlarged/reduced vertical/horizontal target images 621 and 622 are prevented from being cut in the long-side direction.

(8) The enlarged/reduced vertical/horizontal target images 621 and 622 are subjected to the mask processing to cause the enlarged/reduced original image 620 displayed on a lower layer to be transparently displayed, and hence the display region of the enlarged/reduced original image 620 can be set as an entire surface of the display screen 53. In particular, when the enlarged/reduced vertical/horizontal target images 621 and 622 include the base line numbers, it is possible to positively confirm correspondences between building parts and the base line numbers by displaying the base line numbers so as to be superimposed on the enlarged/reduced original image 620 (for example, on building parts (walls or the like)).

(9) Further, the vertical/horizontal target regions 532 and 533 can be moved in the long-side direction, the movement can be performed to a position that is not in the way or a position desired to be confirmed with reference to the enlarged/reduced original image 620 being displayed, which improves convenience.

(10) In particular, the vertical/horizontal target regions 532 and 533 can be moved, and the enlarged/reduced vertical/horizontal target images 621 and 622 displayed within the regions 532 and 533 are subjected to the mask processing. With this configuration, the user can slide the positions of the base line numbers (enlarged/reduced vertical/horizontal target images 621 and 622) while causing the enlarged/reduced original image 620 on the lower layer to be transparent, and hence it is possible to easily determine layout positions of the base line numbers and to easily identify the position which the user wishes to know within the drawing.

REFERENCE SIGNS LIST

50 drawing display device
51 CPU
52 ROM
53 display screen
531 target selection button
532 vertical target region
533 horizontal target region
534 overlapping region
54 communication device
55 image input device
62 RAM
620 enlarged/reduced original image
621 enlarged/reduced vertical target image
622 enlarged/reduced horizontal target image
64 memory for display
66 storage device
68 drawing display program
69 drawing data storage unit
690 original image
692, 693 base line number
70 vertical target image storage unit
700 vertical target image
71 horizontal target image storage unit
710 horizontal target image

The invention claimed is:

1. A drawing display device, comprising:
original image storage means for storing an original image having first and second sides that are perpendicular to each other, the first and second sides defining x and y axis directions of the original image, respectively;
region designation means for designating a desired region that is associated with a specified region of the original image;
desired image saving means for reading a desired image having an area corresponding to the entire area of the designated desired region from the original image and storing the desired image separately from the original image, the desired image being arranged at a position corresponding to a position of the specified region inside the original image along one of the x and y axis directions of the original image and having first and second sides that are perpendicular to each other;
enlargement/reduction ratio acquisition means for acquiring an enlargement/reduction ratio (P) with respect to the original image as the original image is enlarged/reduced;
enlarged/reduced original image creating means for forming an enlarged/reduced original image by changing magnification of the original image by the acquired enlargement/reduction ratio (P) in both the x axis direction of the original image corresponding to the first side of the original image and the y axis direction of the original image corresponding to the second side of the original image;
enlarged/reduced desired image creating means for forming an enlarged/reduced desired image by changing magnification of the desired image by the acquired enlargement/reduction ratio (P) at least in a first direction of the desired image corresponding to the first side of the desired image, in correspondence with the enlargement/reduction of the original image; and
display means for displaying the created enlarged/reduced original image and for displaying the enlarged/reduced desired image along an inner periphery of the display means at the position corresponding to the position of the specified region inside the original image along one of the x and y axis directions of the original image, wherein
the position of the enlarged/reduced desired image relative to the position of the specified region remains the same even after the enlargement/reduction of the original image and the desired image.

2. A drawing display device according to claim 1, wherein the desired region comprises a rectangular region.

3. A drawing display device according to claim 2, wherein the enlarged/reduced desired image creating means changes the magnification of the desired image by the acquired enlargement/reduction ratio (P) in the first direction of the desired region and by a fixed reduction ratio (S) in a second direction of the desired region.

4. A drawing display device according to claim 2 further comprising movement amount acquisition means for acquiring a movement amount for changing a display range of the enlarged/reduced original image,
wherein the display means displays the created enlarged/reduced original image and the enlarged/reduced desired image by moving the enlarged/reduced original image by the acquired movement amount and moving the enlarged/reduced desired image in the first direction of the enlarged/reduced image by a first direction component amount of the acquired movement amount.

5. A drawing display device according to claim 3, wherein:
the region designation means designates the desired region within the original image by designating the rectangular region of the enlarged/reduced desired image displayed by the display means; and
the reduction ratio (S) is an enlargement/reduction ratio of the enlarged/reduced desired image, the enlarged/reduced desired image being displayed by the display means when the rectangular region is designated by the region designation means, to the original image.

6. A drawing display device according to claim 2, wherein the desired image saving means reads and stores the desired image from the original image, an area of the desired image corresponding to an area defined by a width of the desired region in the second direction and a length of the entire area of the original image in the first direction.

7. A drawing display device according to claim 1, wherein the desired image saving means reads the desired image from raster data created with a predetermined resolution when the original image is vector data.

8. A drawing display device according to claim 1, wherein:
the desired image saving means performs mask processing for the read original image and then stores the resultant as the desired image; and
the display means displays the enlarged/reduced desired image superimposed on the enlarged/reduced original image.

9. A drawing display device according to claim 8, wherein the mask processing performed by the desired image saving means comprises processing for causing the enlarged/reduced original image on a lower layer to be transparent with respect to data representing a specific color.

10. A drawing display device according to claim 1, wherein the display means comprises enlarged/reduced desired image moving means for moving a display position of the enlarged/reduced desired image to another position within the enlarged/reduced original image.

11. A non-transitory computer readable storage medium containing a drawing display program for causing a computer to implement:
a region designation function of designating a desired region that is associated with a specified region of an original image stored in an original image storage device, the original image having first and second sides that are perpendicular to each other and that define x and y axis directions of the original image, respectively;
a desired image saving function of reading a desired image having an area corresponding to the entire area of the designated desired region from the original image and storing the desired image separately from the original image, the desired image being arranged at a position corresponding to a position of the specified region inside the original image along one of the x and y axis directions of the original image and having first and second sides that are perpendicular to each other;
an enlargement/reduction ratio acquisition function of acquiring an enlargement/reduction ratio (P) with respect to the original image as the original image is enlarged/reduced;
an enlarged/reduced original image creating function of forming an enlarged/reduced original image by changing magnification of the original image by the acquired enlargement/reduction ratio (P) in both the x axis direction of the original image corresponding to the first side of the original image and the y axis direction of the original image corresponding to the second side of the original image;
an enlarged/reduced desired image creating function of forming an enlarged/reduced desired image by changing magnification of the desired image by the acquired enlargement/reduction ratio (P) at least in the first direction of the desired image corresponding to the first side of the desired image, in correspondence with the enlargement/reduction of the original image; and
a display function of displaying the created enlarged/reduced original image and for displaying the enlarged/reduced desired image along an inner periphery of the display means at the position corresponding to the position of the specified region inside the original image along one of the x and y axis directions of the original image, wherein
the position of the enlarged/reduced desired image relative to the position of the specified region remains the same even after the enlargement/reduction of the original image and the desired image.

* * * * *